(12) United States Patent
Gohara et al.

(10) Patent No.: US 9,673,130 B2
(45) Date of Patent: Jun. 6, 2017

(54) SEMICONDUCTOR DEVICE HAVING A COOLER

(71) Applicant: FUJI ELECTRIC CO., LTD., Kawasaki-shi, Kanagawa (JP)

(72) Inventors: Hiromichi Gohara, Matsumo (JP); Akira Morozumi, Okaya (JP); Takeshi Ichimura, Matsumoto (JP)

(73) Assignee: FUJI ELECTRIC CO., LTD., Kawasaki-shi (JP)

( * ) Notice: Subject to any disclaimer, the term of this patent is extended or adjusted under 35 U.S.C. 154(b) by 0 days.

(21) Appl. No.: 15/225,249

(22) Filed: Aug. 1, 2016

(65) Prior Publication Data
US 2016/0343640 A1    Nov. 24, 2016

Related U.S. Application Data

(63) Continuation of application No. PCT/JP2015/072005, filed on Aug. 3, 2015.

(30) Foreign Application Priority Data

Aug. 6, 2014  (JP) ................................ 2014-160520

(51) Int. Cl.
*H01L 23/48*     (2006.01)
*H01L 23/473*   (2006.01)
(Continued)

(52) U.S. Cl.
CPC ........ *H01L 23/473* (2013.01); *H01L 23/3675* (2013.01); *H05K 7/20927* (2013.01);
(Continued)

(58) Field of Classification Search
CPC ......... H01L 24/29; H01L 24/32; H01L 24/45; H01L 24/48; H01L 24/73; H01L 25/072; H01L 25/18; H01L 23/473; H01L 23/3675

See application file for complete search history.

(56) References Cited

U.S. PATENT DOCUMENTS

| 2005/0128705 A1 | 6/2005 | Chu et al. |
| 2005/0199372 A1 | 9/2005 | Frazer et al. |

(Continued)

FOREIGN PATENT DOCUMENTS

| JP | 3010080 U | 4/1995 |
| JP | 2001-35981 A | 2/2001 |

(Continued)

OTHER PUBLICATIONS

International Search Report, issued in PCT/JP2015/072005, dated Oct. 20, 2015.

(Continued)

*Primary Examiner* — Nicholas Tobergte
(74) *Attorney, Agent, or Firm* — Birch, Stewart, Kolasch & Birch, LLP

(57) ABSTRACT

A cooler 20 of a semiconductor device includes an inlet portion 27 and an outlet portion 28 for a cooling liquid, an inlet path 24, an outlet path 25, and a cooling flow path 26. The inlet path 24 and the outlet path 25 have asymmetrical planar shapes. A connection portion 271 between the inlet path 24 and the inlet portion 27 is opposed to the cooling flow path 26 of a part immediately below plural circuit substrates 13 arranged on the cooler 20. A connection portion 281 between the outlet path 25 and the outlet portion 28 is opposed to the cooling flow path 26 of a part immediately below plural circuit substrates 13 arranged on the cooler 20.

16 Claims, 15 Drawing Sheets

(51) Int. Cl.
*H05K 7/20* (2006.01)
*H01L 25/18* (2006.01)
*H01L 23/367* (2006.01)
*H01L 23/00* (2006.01)
*H01L 25/07* (2006.01)

(52) U.S. Cl.
CPC .......... *H01L 23/3672* (2013.01); *H01L 24/29* (2013.01); *H01L 24/32* (2013.01); *H01L 24/45* (2013.01); *H01L 24/48* (2013.01); *H01L 24/73* (2013.01); *H01L 25/072* (2013.01); *H01L 25/18* (2013.01); *H01L 2224/291* (2013.01); *H01L 2224/32225* (2013.01); *H01L 2224/45655* (2013.01); *H01L 2224/48227* (2013.01); *H01L 2224/73265* (2013.01); *H01L 2924/13055* (2013.01)

(56) References Cited

U.S. PATENT DOCUMENTS

| | | | | |
|---|---|---|---|---|
| 2005/0210906 A1* | 9/2005 | Laufer | .................... | F28F 3/048 62/259.2 |
| 2009/0065178 A1* | 3/2009 | Kasezawa | ............. | H01L 23/473 165/104.19 |
| 2012/0026745 A1* | 2/2012 | Cheng | .................. | F21S 48/328 362/373 |
| 2012/0097366 A1* | 4/2012 | Chen | ........................ | F28F 3/12 165/96 |
| 2012/0097368 A1* | 4/2012 | Chen | ........................ | F28F 3/12 165/104.21 |
| 2012/0097382 A1* | 4/2012 | Chen | ....................... | F28F 19/00 165/185 |
| 2013/0058041 A1 | 3/2013 | Gohara et al. | | |
| 2014/0140117 A1 | 5/2014 | Ishibashi | | |
| 2015/0021756 A1* | 1/2015 | Adachi | ................. | H01L 23/473 257/714 |
| 2015/0102480 A1 | 4/2015 | Nakagawa et al. | | |

FOREIGN PATENT DOCUMENTS

| | | |
|---|---|---|
| JP | 2004-6811 A | 1/2004 |
| JP | 2004-103936 A | 4/2004 |
| JP | 2006-324647 A | 11/2006 |
| JP | 2011-155179 A | 8/2011 |
| JP | 2012-64609 A | 3/2012 |
| JP | 2013-45782 A | 3/2013 |
| JP | 2014-103303 A | 6/2014 |
| JP | 2014-179563 A | 9/2014 |
| JP | 2015-79819 A | 4/2015 |
| WO | WO 2011/132736 A1 | 10/2011 |
| WO | WO 2014/069174 A1 | 5/2014 |

OTHER PUBLICATIONS

Written Opinion of the International Searching Authority, issued in PCT/JP2015/072005, dated Oct. 20, 2015.

* cited by examiner

SEMICONDUCTOR DEVICE HAVING A COOLER

CROSS-REFERENCE TO RELATED APPLICATIONS

This application is a continuation of PCT Application No. PCT/JP2015/072005, filed on Aug. 3, 2015, which claims priority to Japanese Patent Application No. 2014-160520, filed Aug. 6, 2014. The contents of these applications are incorporated herein by reference in their entirety.

TECHNICAL FIELD

The present invention relates to a semiconductor device including a cooler that circulates and distributes a cooling liquid for cooling semiconductor elements.

BACKGROUND ART

Machines using motors, as typified by hybrid automobiles, electric automobiles, and the like, utilize electric power conversion devices for saving energy. For the electric power conversion devices, semiconductor modules are widely utilized. The semiconductor modules include power semiconductor elements to control high current.

Power semiconductor elements generate a large amount of heat when controlling high current. Additionally, downsizing and weight reduction of semiconductor modules are demanded, and output density tends to increase. Thus, in a semiconductor module including a plurality of power semiconductor elements, a cooling method therefor influences electric power conversion efficiency.

In order to improve cooling efficiency for a semiconductor module, a liquid-cooling type cooler is conventionally used. Such a liquid-cooling type cooler incorporates fins as a heat sink and cools by causing a cooling liquid to flow in the cooler in a circulating manner. For liquid-cooling type coolers, various efforts have been made to improve cooling efficiency, such as increase in flow rate of a cooling liquid, improvement in heat transfer rate by miniaturization and complication of fins, or increase in heat transfer rate of a material constituting fins.

However, in a case where the flow rate of a cooling liquid into a cooler is increased or fins are formed into a shape having high heat transfer rate, disadvantages tend to occur such as increase in pressure loss of the cooling liquid in the cooler. Particularly, in a cooler having such a structure that uses a plurality of fins to cool multiple power semiconductor elements, in which the fins are arranged in series in a flow path (Patent Document 1), pressure loss significantly increases. In order to reduce such pressure loss, it is necessary to have a structure that increases cooling efficiency at a small flow rate of the cooling liquid, where the fins are desirably arranged in parallel in the flow path.

As coolers that maintain coolability and reduce pressure loss of a cooling liquid by parallel arrangement of fins in a flow path, there are those in which an inlet path for introducing a cooling liquid and an outlet path for discharging the cooling liquid are arranged in parallel to each other in a case and a plurality of fins are arranged in parallel in a cooling flow path(s) between the paths (Patent Documents 2, 3, and 4).

RELATED ART DOCUMENTS

Patent Documents

Patent Document 1: Japanese Unexamined Patent Application Publication No. 2012-64609

Patent Document 2: Japanese Unexamined Patent Application Publication No. 2004-103936

Patent Document 3: Japanese Unexamined Patent Application Publication No. 2001-35981

Patent Document 4: Japanese Unexamined Patent Application Publication No. 2011-155179

SUMMARY OF THE INVENTION

Problems to be Solved by the Invention

However, in the coolers described in Patent Documents 2 to 4, improvement in coolability by reforms of the fins and the flow path(s) in the case has been made, whereas pressure loss has occurred that was dependent on shapes of the inlet portion and outlet portion for the cooling liquid, connection portions thereof, and the like. Accordingly, these coolers have had a flow path(s) for which the occurrence of a swirling flow was considered but in which pressure increase mainly occurring in the connection portions or the like connected with the inlet portion and the outlet portion was large and placed a large load on a pump. Due to this, when considering the whole systems of the coolers, load for obtaining efficient and stable coolability has been large. In addition, in a case where load on pump performance is large, it is necessary to increase the capacity of the pump or design in a state of a reduced cooling liquid flow rate, causing occurrence of a disadvantage such as increased temperature of heat generated in semiconductor elements. Thus, element lifetimes have been reduced, or breakdown or the like has been likely to occur.

In addition, downsizing and thinning of a cooler while having sufficient coolability are desired for uses in automobiles and the like. Accordingly, it has been desired to reduce pressure loss of a cooling liquid in downsized and thinned coolers.

The present invention has been accomplished in view of such points as above, and it is an object of the invention to provide a semiconductor device that includes a cooler in which improvement has been added to the shapes of connection portions and the like of an inlet portion and an outlet portion for a cooling liquid, and thereby pressure losses in the connection portions and the like have been enabled to be reduced.

Means for Solving the Problems

In order to achieve the object, there is provided a semiconductor device as below:

A semiconductor device includes a first circuit substrate and a second circuit substrate, a first semiconductor element mounted on the first circuit substrate and a second semiconductor element mounted on the second circuit substrate, and a cooler on which the first circuit substrate and the second circuit substrate are mounted and which cools the first semiconductor element and the second semiconductor element. The cooler includes a heat dissipation portion that includes a first surface and a second surface opposing the first surface and on which the first circuit substrate and the second circuit substrate are bonded to the first surface; fins disposed on the second surface; a case that includes a first sidewall and a second sidewall opposing the first sidewall, that houses the fins, and that is connected to the heat dissipation portion; an inlet portion for a cooling liquid disposed on the first sidewall and an outlet portion therefor disposed on the second sidewall; an inlet path connected to the inlet portion and formed along an inner surface of the first sidewall; an outlet path connected to the outlet portion and formed along an inner surface of the second sidewall; and a cooling flow path formed in a position where the fins are housed between the inlet path and the outlet path. Additionally, the inlet path and the outlet path have planar shapes asymmetrical to each other. Additionally, a connection portion between the inlet path and the inlet portion is opposed to the cooling flow path immediately below the second circuit substrate arranged on the cooler. Additionally, a connection portion between the outlet path and the outlet portion is opposed to the cooling flow path immediately below the first circuit substrate arranged on the cooler.

Effects of the Invention

According to the semiconductor device of the present invention, although downsizing and thinning of a cooler is disadvantageous in terms of pressure loss, turbulence in the flow of a cooling liquid is maximally reduced so that pressure loss is reduced, and the connection portions for connecting pipes of the inlet portion and the outlet portion are disposed in appropriate positions against heat generation of the semiconductor elements. Thereby, the semiconductor elements arranged on the outer surface of the cooler can be effectively cooled, so that load on a pump circulating the cooling liquid can be reduced, and stable operation of the semiconductor elements is enabled.

MODE FOR CARRYING OUT THE INVENTION

Embodiments of a semiconductor device of the present invention will be specifically described using the drawings. The terms indicating directions, such as "upper", "lower", "bottom" "front", and "rear", which will appear in the following description, are used by referring to directions in the attached drawings.

First Embodiment

Figure 1:
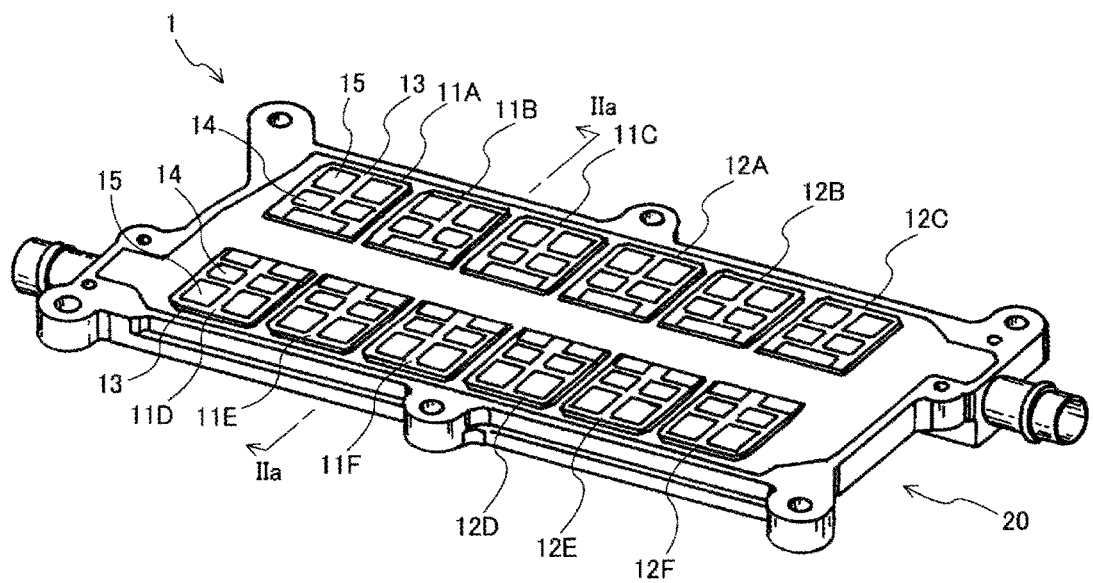
FIG. 1 is a perspective view depicting an appearance of a semiconductor module of a first embodiment of the present invention.
Figure 2A:
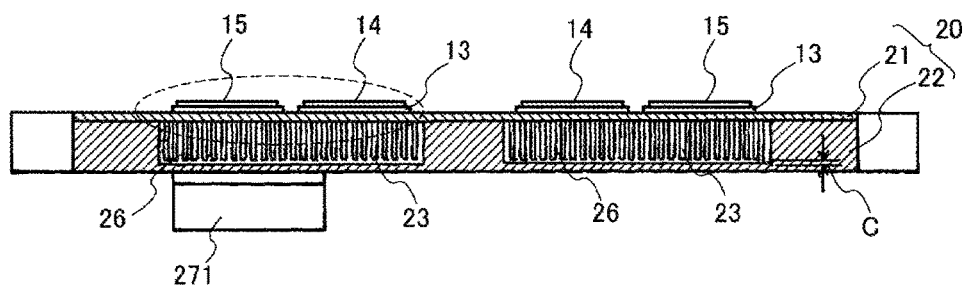
FIG. 2 A is a schematic diagram depicting the semiconductor module of FIG. 1 by a section as viewed from an arrow direction of line IIa-IIa, and FIG. 2 B is a schematic diagram of an enlarged portion of FIG. 2 A.
Figure 2B:
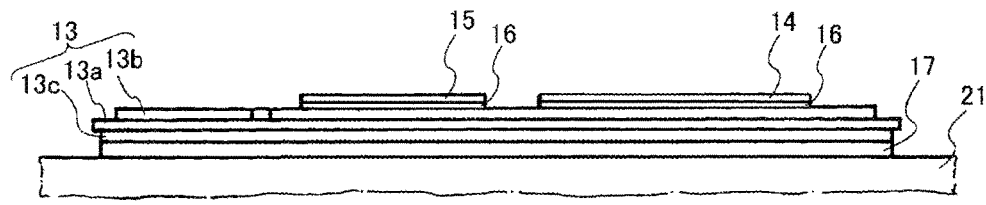

FIG. 1 is a perspective diagram depicting an appearance of one example of a semiconductor module that is one embodiment of the semiconductor device of the invention. FIG. 2 A is a schematic diagram depicting the semiconductor module of FIG. 1 by a section as viewed from an arrow direction of line IIa-IIa, and FIG. 2 B is a schematic diagram of an enlarged portion of FIG. 2 A.

A semiconductor module 1 includes a plurality of circuit element units 11A to 11F and 12A to 12F and a cooler 20 to which the circuit element units 11A to 11F and 12A to 12F are connected, as depicted in FIG. 1 and FIGS. 2 A and 2 B.

The respective circuit element units 11A to 11F and 12A to 12F all have a structure, for example, in which two kinds of semiconductor elements 14 and 15 are mounted two by two, four in total on a circuit substrate 13. The circuit substrate 13 has a structure in which conductor layers 13b and 13c are formed on both surfaces of an insulation plate 13a, as can be seen in FIG. 2 B.

As the insulation plate 13a of the circuit substrate 13, for example, an insulating ceramic substrate of aluminum nitride, aluminum oxide, or the like can be used. The conductor layers 13b and 13c can be formed using a metal such as copper or aluminum (for example, a copper foil).

The semiconductor elements 14 and 15 are bonded to a conductor layer 13b side on which a circuit pattern of the circuit substrate 13 is formed, by using a bonding layer 16 of solder or the like, and are electrically connected to the conductor layer 13b through the bonding layer 16, or via a bonding wire, a bus bar, or the like (unillustrated). The circuit substrate 13 on which the semiconductor elements 14 and 15 are mounted is bonded onto a heat dissipation substrate 21 of the cooler 20 via a bonding layer 17 on another conductor layer 13c side.

In this way, the circuit substrate 13 and the semiconductor elements 14 and 15 are brought into a state where they are connected in a heat-conductable manner to the cooler 20. In addition, on exposed surfaces of the conductor layers 13b and 13c and on a surface of the bonding wire or the like (unillustrated) electrically connecting the semiconductor elements 14 and 15 with the conductor layer 13b, there may be formed a protective layer of nickel plating or the like to protect those surfaces from contamination, corrosion, external forces, and the like.

As such semiconductor elements 14 and 15 mounted on the circuit substrate 13, power semiconductor element chips are used in the illustrated example. The semiconductor element 14 as one of these power semiconductor elements is a free wheeling diode (FWD), and the semiconductor element 15 as the other one thereof is an insulated gate bipolar transistor (IGBT).

Figure 3:
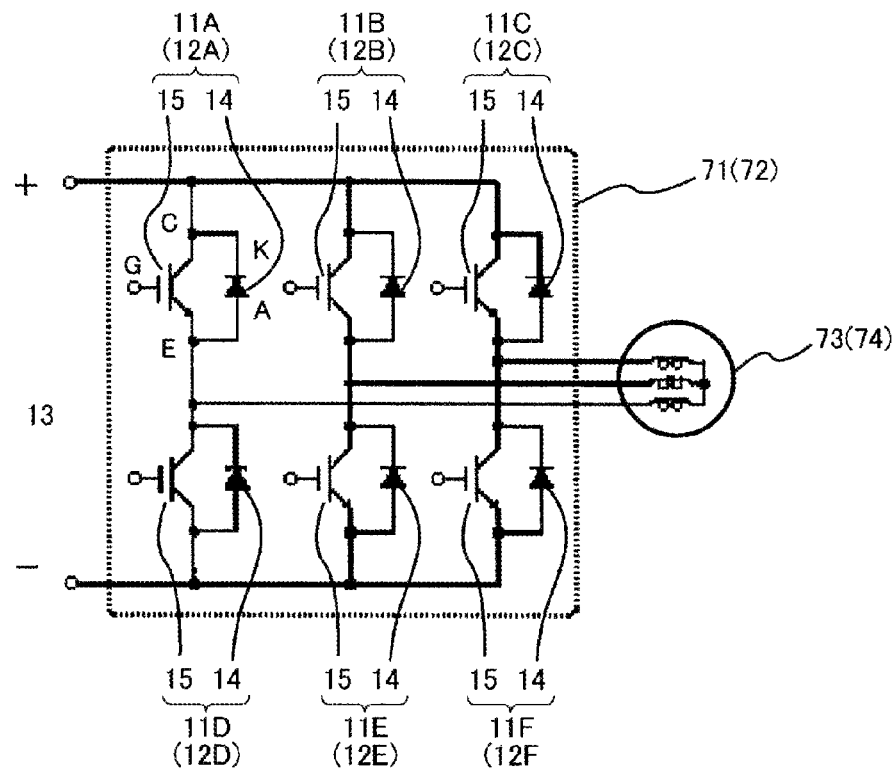
FIG. 3 is a diagram depicting one example of an electric power conversion circuit constituted as the semiconductor module.

The semiconductor module 1 can form an inverter circuit 71 by the six circuit element units 11A to 11F, and can form an inverter circuit 72 by the six circuit element units 12A to 12F, as depicted in FIG. 3.

The inverter circuits 71 and 72 of FIG. 3 exemplify inverter circuits that convert direct current into alternating current to supply to three-phase alternating current motors 73 and 74. The inverter circuit 71 is configured to perform input/output and control by using the circuit element units 11A to 11C as upper arms and the circuit element units 11D to 11F as lower arms and connecting wires (unillustrated) by wire bonding, a bus bar, or the like thereto. In addition, the inverter circuit 72 is configured to perform input/output and control by using the 12A to 12C as upper arms and the 12D to 12F as lower arms and connecting wires (unillustrated) by wire bonding, a bus bar, or the like thereto. These inverter circuits 71 and 72 respectively include a bridge circuit of the semiconductor element 15 that is an IGBT and the semiconductor element 14 that is an FWD for each of three phases: U-phase, V-phase, and W-phase. Switching control of the semiconductor elements 15 are performed to convert direct current into alternating current, whereby the three-phase alternating current motors 73 and 74 can be driven.

An electric power conversion circuit depicted in FIG. 3 constitutes the inverter circuit 71 or 72 by the six circuit element units 11A to 11F or the six circuit element units 12A to 12F. However, as in FIG. 1 depicting the twelve circuit element units 11A to 11F and 12A to 12F, the number of circuit element units that are mounted on the cooler 20 is not limited to six. In FIG. 1, inverter circuits for controlling the two three-phase alternating current motors 73 and 74 are configured to have a total of 12 circuit element units in which, for the inverter circuit 71, the 11A to 11C as the upper arms and the 11D to 11F as the lower arms are mounted on the cooler 20, and, for the inverter circuit 72, the 12A to 12C as the upper arms and the 12D to 12F as the lower arms are mounted on the cooler 20, respectively. Examples of other structures include a structure in which circuit element units using predetermined numbers of IGBTs and FWDs for performing step-up and step-down control are mounted on the cooler. In any structure, the cooler 20 is used that has a size adapted to an arrangement area for the circuit element units.

In the example depicted in FIG. 1, the cooler 20 includes a case 22 having a box shape with an opening on an upper side thereof, a heat dissipation substrate (heat dissipation portion) 21 having a planar plate shape connected to upper ends of sidewalls of the case 22 without causing liquid leakage, and fins 23 that are attached to a surface (second surface) of the heat dissipation substrate 21 opposite to a surface (first surface) thereof to which the respective circuit element units 11A to 11F and 12A to 12F are bonded and that have heat exchangeability as a heat sink. The plurality of fins 23 are housed in an inside of the case 22 and tightly sealed by metallically bonding the case 22 and the heat dissipation substrate 21 to each other or interposing a sealing member therebetween. In order to facilitate the metallic bonding between the case 22 and the heat dissipation substrate 21, respective bonding portions of the case 22 and the heat dissipation substrate 21 are preferably flattened.

Heat generated in the respective circuit element units 11A to 11F and 12A to 12F during operation of the electric power conversion circuit previously described using FIG. 3 is transferred to the heat dissipation substrate 21 through the bonding layer 17 and further transferred to the fins 23. Since the fins 23 in the cooler 20 are arranged in a cooling flow path that will be described later, the fins 23 are cooled by distribution of a cooling liquid into the cooling flow path. The circuit element units 11A to 11F and 12A to 12F that generate heat are cooled by the cooler 20 in this manner.

Figure 4:
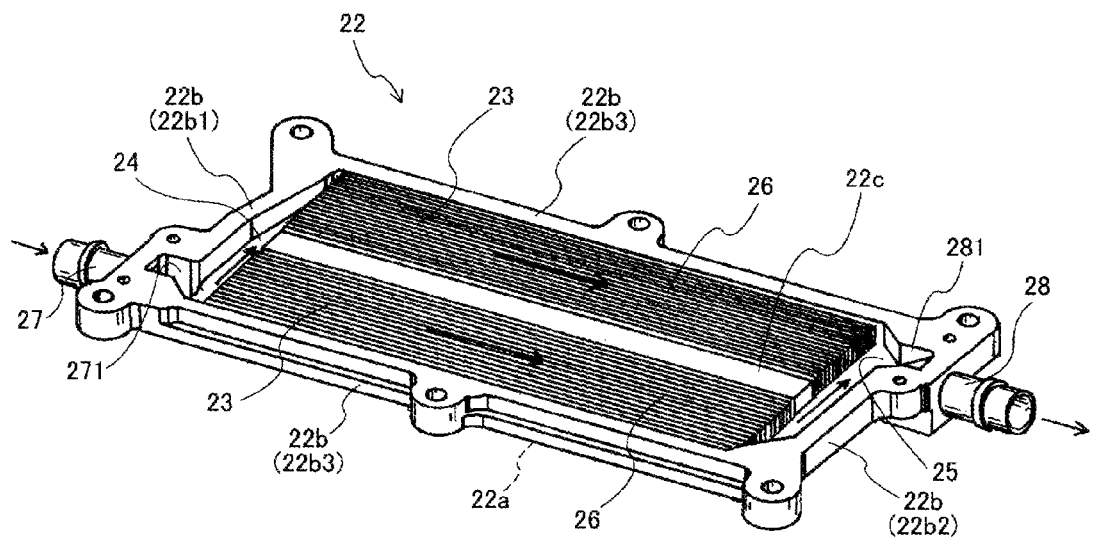
FIG. 4 is a perspective view depicting a main part structure of a case of a cooler of the semiconductor module.
Figure 5:
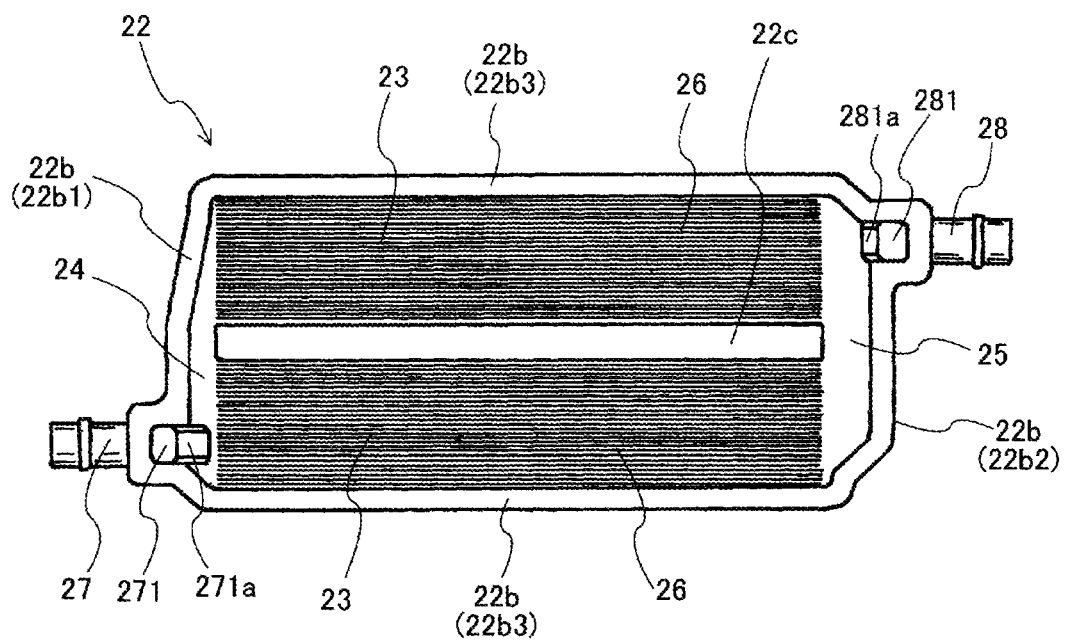
FIG. 5 is a plan view depicting an inner structure of the case of FIG. 4.

FIG. 4 is a perspective view depicting a main part structure of the case 22 of the cooler 20, in which arrows indicate a direction in which a cooling liquid flows. In addition, for descriptive convenience, the drawing illustrates the fins 23 attached onto the heat dissipation substrate 21. FIG. 5 is a plan view depicting an inner structure of the cooler 20 depicted in FIG. 4.

As depicted in FIGS. 4 and 5, an outer shape of the case 22 of the cooler 20 is a substantially rectangular parallelepiped shape having a bottom wall 22a and sidewalls 22b. In the inside of the case 22 are formed an inlet path 24 for introducing a cooling liquid to the fins 23, an outlet path 25 for discharging the cooling liquid having passed between the fins 23, and a cooling flow path 26 with the fins 23 arranged therein. Furthermore, on a first sidewall of the sidewalls 22b of the case 22, i.e., on a sidewall 22b1 at one of short sides of the case 22 is disposed an inlet portion 27 provided with an inlet for introducing a cooling liquid into the inside of the case 22. Still furthermore, on a second sidewall of the sidewalls 22b of the case 22, i.e., on a sidewall 22b2 at the other one of the short sides of the case 22 is disposed an outlet portion 28 provided with an outlet for discharging the cooling liquid from the inside of the case 22 to the outside thereof. The inlet portion 27 and the outlet portion 28 are, for example, cylindrically shaped. The inlet portion 27 and the outlet portion 28 are located slightly inward from diagonal positions of the case 22. Axial lines of the inlet portion 27 and the outlet portion 28 are substantially in parallel with longitudinal direction of the cooling flow path 26, i.e., a direction in which a cooling liquid is distributed in the cooling flow path 26 (a direction indicated by the arrows of FIG. 4). Additionally, as illustrated in FIG. 1, the circuit element units 11A to 11C and 12A to 12C as the upper arms and the circuit element units 11D to 11F and 12D to 12F as the lower arms respectively are arranged in two columns so as to be parallel along the flowing directions of the cooling liquid. A plurality of upper arm circuit substrates 13 (first circuit substrates) and a plurality of lower *arum* circuit substrates 13 (second circuit substrates) respectively are aligned and arranged in parallel.

The inlet path 24 is formed along an inner surface of the sidewall 22b1 at one of the short sides of the case 22 where the inlet portion 27 is disposed. Additionally, a connection portion 271 is disposed between the inlet path 24 and the inlet portion 27, and the inlet path 24 is formed to disperse a cooling liquid introduced from the connection portion 271 and flow the cooling liquid into the cooling flow path 26. The connection portion 271 is disposed opposing a part positioned immediately below the circuit substrates 13 in the cooling flow path. In the illustrated example, the connection portion 271 is disposed at a part opposing the cooling flow path 26 of a semiconductor element 15 (second semiconductor element) side mounted on the lower arm circuit element unit 11D.

The outlet path 25 is formed along an inner surface of the sidewall 22b2 at the short side of the case 22 where the outlet portion 28 is disposed. Additionally, a connection portion 281 is disposed between the outlet path 25 and the outlet portion 28, and the outlet path 25 is formed to discharge the cooling liquid having passed through the cooling flow path 26 to the outlet portion 28. The connection portion 281 is disposed opposing a part positioned immediately below the circuit substrates 13 in the cooling flow path. In the illustrated example, the connection portion 281 is disposed at a part opposing the cooling flow path 26 of a semiconductor element 15 (first semiconductor element) side mounted on the upper arm circuit element unit 12C.

The cooling flow path 26 is formed in a position where the fins 23 are housed, between the inlet path 24 and the outlet path 25, and are thereby configured to flow a cooling liquid to parts necessary for cooling the fins 23 as a heat sink. Since the inlet path 24 and the outlet path 25 are formed along the sidewalls 22b1 and 22b2 at the short sides of the case 22, the cooling flow path 26 has a longer cooling liquid distributing direction length than cooling liquid distributing direction lengths in the inlet path 24 and the outlet path 25. This is advantageous in terms of downsizing the cooler 20.

Additionally, the cooling flow path 26 can be split into a plurality of flow paths according to positions of the circuit element units 11A to 11F and 12A to 12F. For example, in the present embodiment depicted in FIG. 4, the cooling flow path 26 is split into two by a partition 22c connecting to the inlet path 24 and the outlet path 25. However, as in a third embodiment that will be described later using FIG. 10, a structure without the partition 22c can be used, which is preferable from the viewpoint of reducing pressure loss. The longitudinal directions of the inlet path 24 and the outlet path 25 are substantially orthogonal to the longitudinal direction of the cooling flow path 26.

In the heat dissipation substrate 21, heat is generated in positions to which the circuit element units 11A to 11F and 12A to 12F with the semiconductor elements 14 and 15 mounted thereon are bonded. Thus, the cooling flow path 26 is split into two in the longitudinal direction, and the split flow paths are made corresponding to each of the upper arm circuit element units 11A to 11C and 12A to 12C and the lower arm circuit element units 11D to 11F and 12D to 12F of the inverter circuits. In other words, two cooling flow paths are formed that respectively flow in parallel immediately below those circuit element units.

The plurality of fins 23 are disposed in the cooling flow path 26. The heat sink comprising the plurality of fins has a substantially rectangular parallelepiped outer shape and is disposed in parallel to a direction in which a cooling liquid flows in the cooling flow path 26.

Figure 6:
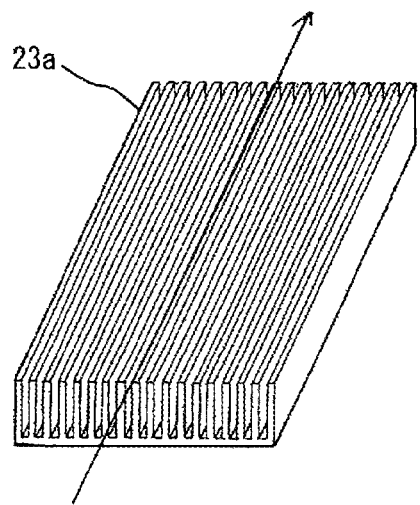
FIG. 6 are diagrams illustrating two types of shapes of fins, in which FIG. 6 A is a perspective view depicting blade fins and FIG. 6 B is a perspective view depicting corrugated fins.
Figure 6:
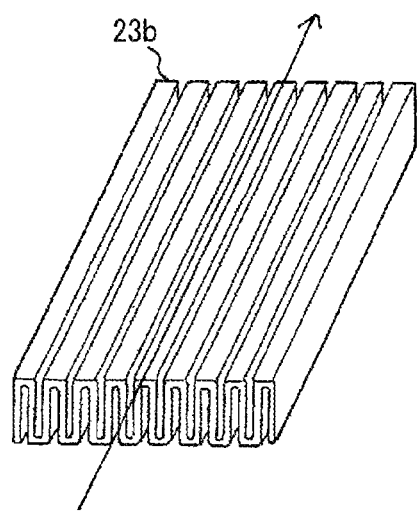

FIG. 6 is an illustrative view of the shape of the fins. For example, as depicted in FIG. 6 A, the fins 23 of the cooler 20 can be formed as a plurality of blade fins 23a where plate-shaped fin elements are disposed in parallel. The blade fins 23a are arranged in the cooling flow path 26, through which a cooling liquid is distributed in a direction indicated by an arrow in FIG. 6 A. The blade fins 23a are fixed to and integrated with the heat dissipation substrate 21. The fins 23 of the cooler 20 are not limited to the blade fins 23a of FIG. 6 A, and corrugated fins 23b depicted in FIG. 6 B may also be used. Additionally, as will be described later, there can be used a structure of a multi-hole plate obtained by integrally forming the heat dissipation substrate 21, the fins 23, and the bottom wall 22a of the case 22 by extrusion molding.

The blade fins 23a, when integrated with the heat dissipation substrate 21 and disposed in the case 22, are formed into such a size (height) that there is a certain amount of clearance C between tips thereof and the bottom wall 22a of the case 22. Additionally, in the case of the corrugated fins 23b, the fins are formed into a shape without any clearance C by being integrated with the case 22 by brazing.

As for the fin shape of the fins 23, those having various shapes conventionally known can be used. However, since the fins 23 serve as a resistance against a cooling liquid flowing in the cooling flow path 26, they desirably have small pressure loss against the cooling liquid, and thus, the blade fins 23a and the corrugated fins 23b described above are preferable. In addition, the shape and size of the fins 23 are preferably set as appropriate in consideration of conditions for introducing a cooling liquid into the cooler 20 (i.e., such as pump performance), the kind of the cooling liquid (such as viscosity), an intended amount of heat to be removed, and the like. Additionally, the outer shape of the heat sink comprising the fins 23 is substantially rectangular parallelepiped, preferably rectangular parallelepiped, and may be a shape chamfered or modified in a range not impairing the effects of the invention.

When using the cooler 20, for example, a pipe (unillustrated) that is connected to a pump (unillustrated) disposed on an upstream side of the inlet portion 27 is connected to the inlet portion 27, and a pipe (unillustrated) that is connected to a heat exchanger (unillustrated) disposed on a downstream side of the outlet portion 28 is connected to the outlet portion 28. A cooling liquid after having been heat-exchanged by the heat exchanger is introduced to the pump, whereby there is formed a closed-loop cooling liquid flow path that includes the cooler 20, the pump, and the heat exchanger. The cooling liquid is forcibly circulated by the pump in such a closed loop. As the cooling liquid, there can be used a known cooling medium, such as water or a long life coolant (LLC).

Heights (diameters) of openings of the inlet portion 27 and the outlet portion 28 disposed at the sidewalls 22b1 and 22b2 of the case 22 have predetermined sizes so that a predetermined flow rate of a cooling liquid can be introduced into and discharged from the case 22 at low load. Additionally, the inlet path 24, the outlet path 25, and the cooling flow path 26 in the case 22 are made as small and thin as possible in a range having a predetermined coolability. For example, a ratio of a thickness of the cooling flow path 26 to an entire width of the cooling flow path 26, i.e., a length of an inner span between two sidewalls 22b3 in the longitudinal direction of the case 22 is made thin so as to be about from 1:8 to 1:12. Due to this, as depicted in FIGS. 1 and 2, in the cooler 20, the height of the opening of the inlet portion 27 is higher than a height of the inlet path 24. Similarly, the height of the opening of the outlet portion 28 is higher than a height of the outlet path 25.

Figure 7:
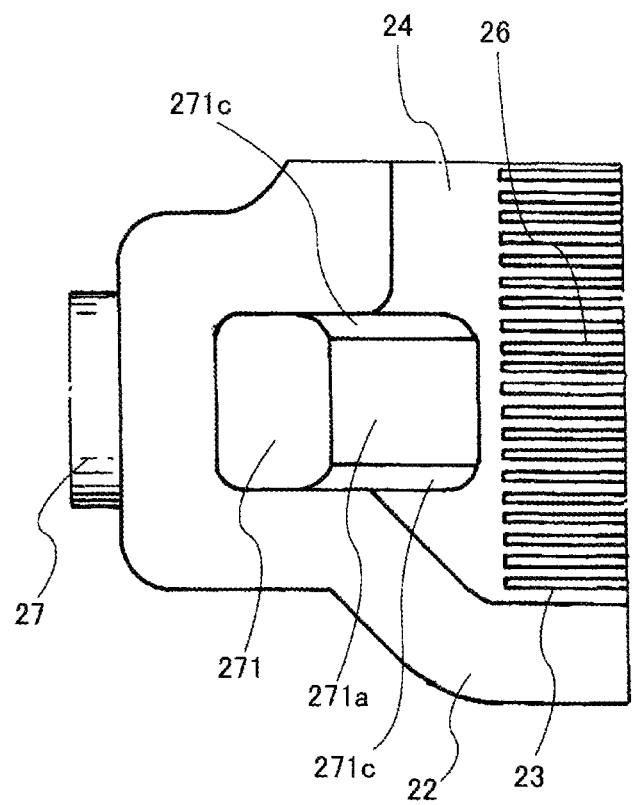
FIG. 7 is an enlarged view of a vicinity of a connection portion in a semiconductor module of a first embodiment.

The connection portion 271 between the inlet portion 27 and the inlet path 24 has a first inclined surface 271a that is inclined from a bottom surface in a depthwise direction (the longitudinal direction of the cooling flow path 26) as viewed from the inlet portion 27 to be connected to a bottom surface of the inlet path 24, as depicted in an enlarged view of a vicinity of the connection portion 271 in FIG. 7. A bottom surface of the inlet portion 27 is formed to be apart from the bottom surfaces of the inlet path 24 and the cooling flow path 26 in a thickness direction of the cooler 20 from the tips of the fins 23. The first inclined surface 271a and the bottom surface of the inlet path 24 are connected by curved surfaces 271c. The first inclined surface 271a is inclined toward an upper side of the cooler 20, the fins 23.

Since the connection portion 271 includes the first inclined surface 271a, a cooling liquid introduced from the inlet portion 27 flows along the first inclined surface 271a to be introduced to the inlet path 24 and the cooling flow path 26 while a flow path sectional area in the flowing direction of the cooling liquid is gradually being reduced.

As with the inlet portion 27 side, at the outlet portion 28 side, the connection portion 281 between the outlet portion 28 and the outlet path 25 has a first inclined surface 281a that is inclined from a bottom surface in a depthwise direction (the longitudinal direction of the cooling flow path 26) as viewed from the outlet portion 28 to be connected to a bottom surface of the outlet path 25. A bottom surface of the outlet portion 28 is formed to be apart from the bottom surfaces of the outlet path 25 and the cooling flow path 26 in the thickness direction of the cooler 20 from the tips of the fins 23. The first inclined surface 281a and the bottom surface of the outlet path 25 are connected by curved surfaces 281c. The first inclined surface 281a is inclined toward the upper side of the cooler 20, the fins 23.

Since the connection portion 281 includes the first inclined surface 281a, a cooling liquid having passed through the outlet path 25 from the cooling flow path 26 flows along the first inclined surface 281a to be directed to the outlet portion 28.

Figure 8:
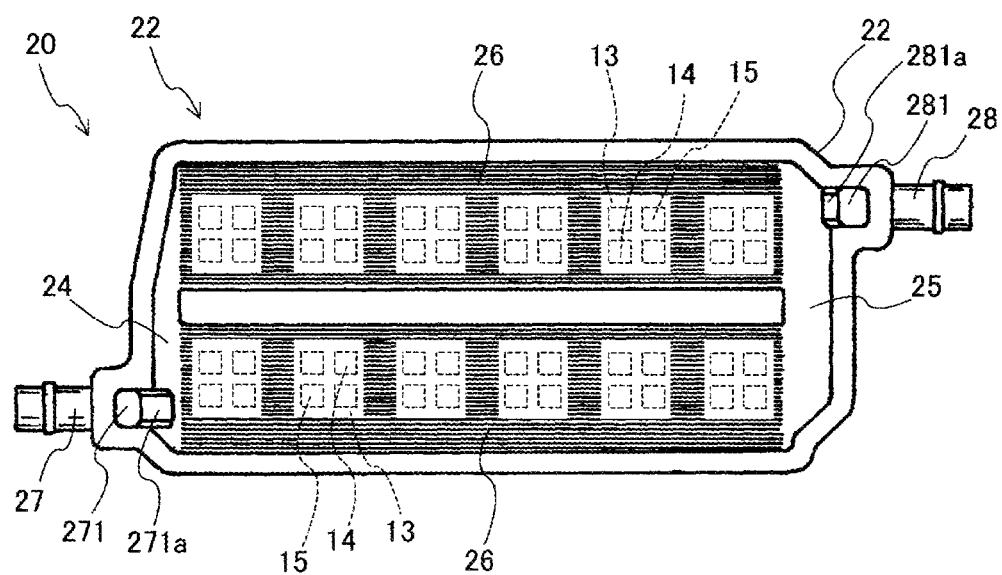
FIG. 8 is a plan view depicting a positional relationship between cooling flow paths of the case and circuit substrates.

As depicted in FIG. 8, the connection portion 271 at the inlet portion 27 side is disposed in a position opposing a part immediately below the lower arm circuit substrates 13 in the cooling flow path 26. Thereby, in the cooling flow path 26, a cooling liquid from the inlet portion 27 can be straightly introduced to the fins of the part immediately below the circuit substrates 13 where temperature tends to be highest, so that a flow rate of the cooling liquid directed to the fins of the part immediately below the circuit substrates 13 can be made higher than in other parts, as a result of which the semiconductor elements 14 and 15 on the circuit substrates can be effectively cooled. Of the semiconductor elements 14 and 15, the semiconductor elements 15 that are IGBT chips generate more heat than the semiconductor elements 14 that are FWD chips. Thus, the connection portion 271 at the inlet portion 27 side is more preferably disposed in the position opposing the part immediately below the semiconductor elements 15 (second semiconductor elements) in the cooling flow path 26. The connection portion 271 at the inlet portion 27 side is positioned closer to the center from an end of the inlet path by a length corresponding to 1/10 to 1/3 of the entire width of the cooling flow path 26.

Additionally, the connection portion 281 at the outlet portion 28 side is similarly disposed in a position opposing a part immediately below the circuit substrates 13 in the cooling flow path 26. Thereby, in the cooling flow path 26, a cooling liquid having passed between the fins 23 of the part immediately below the circuit substrates 13 where temperature tends to be highest can be straightly introduced to the outlet portion 28, so that the flow rate of the cooling liquid having passed between the fins 23 of the part immediately below the circuit substrates 13 can be made higher than in other parts, as a result of which the semiconductor elements 14 and 15 on the circuit substrates can be effectively cooled. Of the semiconductor elements 14 and 15, the semiconductor elements 15 that are IGBT chips generate more heat than the semiconductor elements 14 that are FWD chips. Thus, the connection portion 281 at the outlet portion 28 side is more preferably disposed in the position opposing the part immediately below the semiconductor elements 15 (first semiconductor elements) in the cooling flow path 26. The connection portion 281 at the outlet portion 28 side is positioned closer to the center from an end of the outlet path by a length corresponding to 1/10 to 1/3 of the entire width of the cooling flow path 26.

The inlet path 24 and the outlet path 25 have planar shapes asymmetrical to each other. Specifically, the inlet path 24 is a flow path that has a narrower width than the outlet path 25 so that a cooling liquid flows as evenly as possible from one end of the widthwise direction of the cooling flow path 26 to the other end thereof. In contrast to this, the outlet path 25 is a flow path that is wide to some extent so that the cooling liquid flows without much resistance from the cooling flow path 26 to the outlet portion. In the illustrated example, the outlet path 25 is larger in capacity than the inlet path 24.

Additionally, the inlet path 24 is formed into a shape having a flow path width tapered toward a downstream side of the inlet path 24 so that a cross-sectional area of the inlet path 24 is decreased on the downstream side of the inlet path 24. Thereby, flow rate distribution of the cooling liquid can be equalized between the cooling flow path 26 connecting with the downstream side of the inlet path 24 and the cooling flow path 26 connecting with the upstream side of the inlet path 24. In contrast to this, the outlet path 25 does not have a shape having a flow path width tapered toward a downstream side thereof as in the inlet path 24.

The inlet path 24 and the outlet path 25 have mutually different, i.e., asymmetrical, planar shapes and thus effectively contribute to pressure loss reduction.

The case 22 having such a structure can be formed using a metallic material such as, for example, aluminum, an aluminum alloy, copper, or a copper alloy. For example, a material such as A1050 or A6063 is preferable. In a case where it is necessary to seal the case 22 together with peripheral members, particularly, with fixed portions and an inverter case housing the power module, a material such as ADC12 or A6061 is preferable. In addition, in a case where the case 22 is produced by die casting and is required to have heat conductivity, it is also possible to apply a material from DMS series that are high heat conductivity aluminum alloys for die casting, available from Mitsubishi Plastics, Inc. When forming the case 22 by using such a metallic material, the inlet path 24, the outlet path 25, the cooling flow path 26, the inlet portion 27 and the connection portion 271, and the outlet portion 28 and the connection portion 281 as described above can be formed by, for example, die casting. The connection portion 271 and the connection portion 281 are formed into a complicated shape. However, die casting can facilitate production of the case 22 having such a complicated shape. Besides them, any carbon filler-containing metallic material can also be used for the case 22. In addition, depending on the kind of the cooling liquid and the temperature and the like of the cooling liquid flowing in the case 22, it is also possible to use a ceramic material, a resin material, or the like.

As with the case 22, the fins 23 and the heat dissipation substrate 21 can also be formed using a metallic material such as, for example, aluminum, an aluminum alloy, copper, a copper alloy. For example, A1050, A6063, or the like is preferable. More preferably, aluminum having a heat conductivity of 200 W/mK or higher can be used. The fins 23 and the heat dissipation substrate 21 may be made of the same kind of metallic material or different kinds of metallic materials. Besides the blade fins 23a and the corrugated fins 23b described above, the fins 23 can be formed, for example, by bonding predetermined pins or plate bodies formed using a metallic material to a metallic substrate. Additionally, the fins 23 can be formed integrally with the heat dissipation substrate 21 itself by die casting, brazing, or the like. Furthermore, the fins 23 can also be formed by forming a part for forming the fins 23 into a shape protruding from the heat dissipation substrate 21 by die casting and then cutting the part into a fin shape by a wire cutting method. Furthermore, molding a multi-hole plate by extrusion molding of a metallic material allows formation of a shape in which the heat dissipation substrate 21, the fins 23, and the case 22 are integrally formed.

Upper ends of the sidewalls 22b of the case 22 and ends of the heat dissipation substrate 21 can be sealed with an O-ring or the like interposed therebetween, but are preferably metallically bonded along the sidewalls 22b because liquid leakage can be surely prevented. The metallic bonding is more preferably friction stir welding. Bonding portions by friction stir welding have a metallic structure inherent to friction stir welding. Friction stir welding can ensure the bonding between the upper ends of the sidewalls 22b of the case 22 and the ends of the heat dissipation substrate 21. Additionally, friction stir welding can bond by making a tool of friction stir welding contact with an interface to be bonded between the case 22 and the heat dissipation substrate 21 from above while supporting the bottom surface of the case 22, so that more reliable bonding can be made. Furthermore, bonding by friction stir welding can improve heat dissipation using, as the material of the heat dissipation substrate 21, any of materials having high heat conductivity such as, for example, A6063 and alloys of DMS series, and HT-1 that is a high heat conductive aluminium alloy for die casting, manufactured by DAIKI Aluminum Industry Co., Ltd. In other words, heat dissipation can be improved using, as the material of the heat dissipation substrate 21, a material having a different composition from the material of the case 22, which is a material having a higher heat conductivity than the case 22.

In the case where the case 22 has the partition 22c, the partition 22c also is preferably bonded with the heat dissipation substrate 21 by friction stir welding, because the bonding can prevent expansion of the clearance C between the fins 23 and the bottom wall 22a of the case 22 due to thermal deformation of the heat dissipation substrate 21.

In the case of bonding the case 22 with the heat dissipation substrate 21 by friction stir welding, it is preferable that the upper ends of the sidewalls 22b of the case 22 and the ends of the heat dissipation substrate 21 are at least flat and preferably the heat dissipation substrate 21 has a flat plate-shape, in terms of facilitating bonding work. Additionally, the heat dissipation substrate 21 can be provided with reliability against thermal deformation and favorable heat dissipation by having a predetermined thickness. For example, in a region where the fins are bonded, the thickness of the heat dissipation substrate 21 is desirably from 1 to 3 mm. Furthermore, locating the inlet portion 27 so that an upper surface of the inlet portion 27 is positioned lower than the bottom surface of the heat dissipation substrate 21 can make small turbulence that occurs at the inlet portion 27 and the connection portion 271. Thus, bonding work can be facilitated, and cooling efficiency can be improved.

In this manner, cooling efficiency can be improved by the cooler 20 in which the axial line of the connection portion 271 is opposed to the cooling flow path 26 of the part immediately below the circuit substrates 13 and the axial line of the connection portion 281 is opposed to the cooling flow path 26 of the part immediately below the circuit substrates 13.

Second Embodiment

Next, a semiconductor device of a second embodiment of the present invention will be described. The semiconductor device of the present embodiment has the same structure as the semiconductor device of the first embodiment, except for the shapes of the connection portion 271 and the connection portion 281 in the semiconductor device of the first embodiment. Accordingly, the shapes of the connection portion 271 and the connection portion 281 will be described below. Additionally, the same reference symbols are given to members and parts thereof having the same functions as the members and parts thereof given in FIG. 5 and FIG. 7 describing the semiconductor device of the first embodiment, and thus duplicated descriptions thereof are omitted below.

Figure 9:
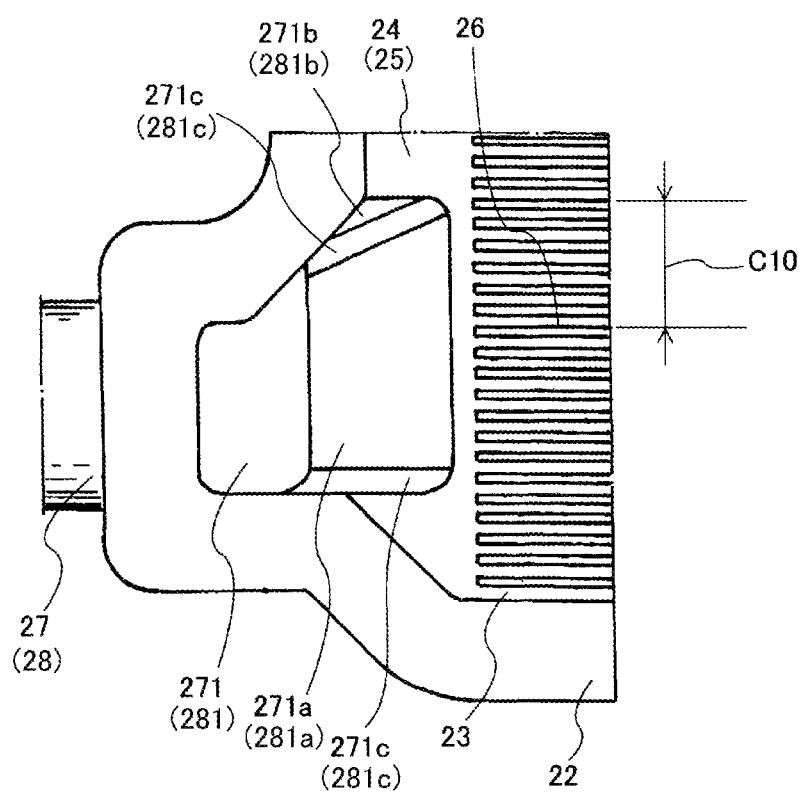
FIG. 9 is an enlarged view of a vicinity of a connection portion in a semiconductor module of a second embodiment.

FIG. 9 depicts an enlarged view of the connection portion 271 of the semiconductor device of the second embodiment. The first inclined surface 271a of the connection portion 271 of FIG. 9 has a shape extending to the bottom surface side of the inlet path 24, as compared to the first inclined surface 271a of the first embodiment depicted in FIG. 7. Additionally, between the curved surface 271c and the bottom surface of the inlet path 24 is provided a second inclined surface 271b inclined from a bottom surface in the longitudinal direction of the inlet path 24 to be connected to the bottom surface of the inlet path 24. The second inclined surface 271b also is inclined toward the upper side of the cooler 20. An angle formed by an upper surface of the cooler 20 and the second inclined surface 271b is smaller than 90 degrees.

In the semiconductor device of the second embodiment, the connection portion 271 includes the second inclined surface 271b, whereby a cooling liquid introduced from the inlet portion 27 flows along the second inclined surface 271b in the longitudinal direction of the inlet path 24, and is introduced to the inlet path 24 while a flow path sectional area in the flowing direction is being gradually enlarged. Accordingly, in the semiconductor device of the second embodiment in which the connection portion 271 includes not only the first inclined surface 271a but also the second inclined surface 271b, the flow path of the connection portion 271 can be partially enlarged as compared to the semiconductor device of the first embodiment. Thus, pressure loss in the connection portion 271 can be more effectively reduced. Thereby, the semiconductor elements 14 and 15 of the circuit element units 11A to 11F and 12A to 12F bonded to the heat dissipation substrate 21 of the cooler 20 can be effectively cooled, so that load on the pump circulating the cooling liquid can be reduced and stable operation of the semiconductor elements is enabled.

The enlarged view of FIG. 9 illustrates the connection portion 271 of the inlet portion 27. However, similarly, the connection portion 281 of the outlet portion 28 can also be formed to have a structure in which the first inclined surface 281a has a shape extending to the bottom surface side of the outlet path 25, as compared to the first inclined surface 281a of the first embodiment depicted in FIG. 7, and between the curved surface 281c and the bottom surface of the outlet path 25 is provided a second inclined surface 281b inclined from a bottom surface in the longitudinal direction of the outlet path 25 to be connected to the bottom surface of the outlet path 25 (see FIG. 11). Since the connection portion 281 of the outlet portion 28 includes the first inclined surface 281a and the second inclined surface 281b, pressure loss in the connection portion 281 can be more effectively reduced.

Third Embodiment

Next, a semiconductor device of a third embodiment of the present invention will be described. The semiconductor device of the present embodiment has the same structure as the semiconductor device of the first embodiment, except for the structure of the cooling flow path 26 in the semiconductor device of the first embodiment. Accordingly, the structure of the cooling flow path 26 in the present embodiment will be described below.

Figure 10:
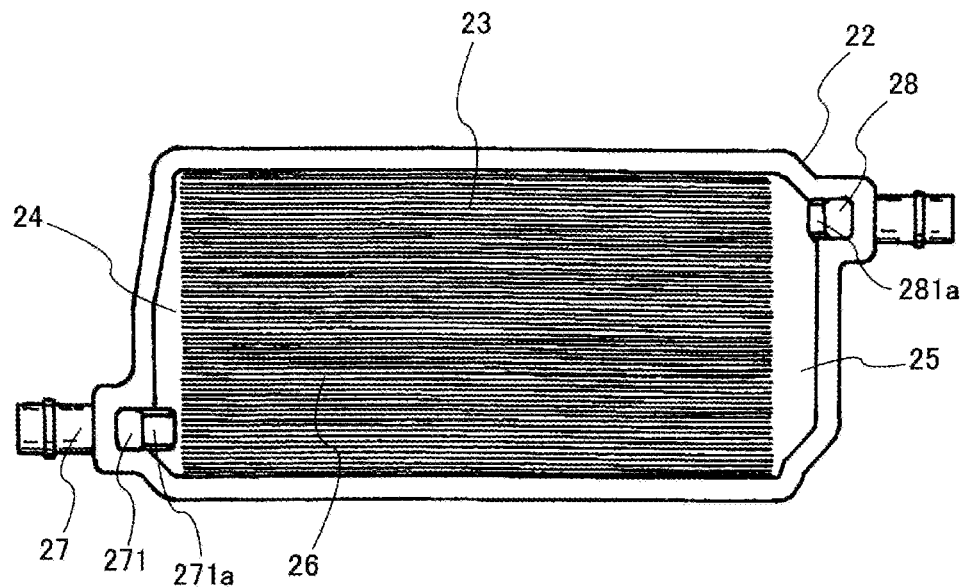
FIG. 10 is a plan view depicting an inner structure of a case of a semiconductor module of a third embodiment.

FIG. 10 depicts a plan view depicting an inner structure of the cooler 20 in the semiconductor device of the present embodiment. FIG. 10 is a drawing corresponding to FIG. 5 depicting the cooler of the first embodiment, and the same members as those depicted in FIG. 5 are denoted by the same reference symbols. Thus, duplicated descriptions of the respective members are omitted.

The case 22 depicted in FIG. 10 is different from the case 22 of the semiconductor device of the first embodiment depicted in FIG. 5 in terms of the presence or absence of the partition 22c connecting to the inlet path 24 and the outlet path 25. The case 22 of the present embodiment does not include the partition 22c depicted in FIG. 5, whereby the cooling flow path 26 of FIG. 10 can further reduce pressure loss in the entire cooling flow path 26, as compared to the cooling flow path 26 of the first embodiment depicted in FIG. 5.

Fourth Embodiment

Next, a semiconductor device of a fourth embodiment of the present invention will be described using FIG. 11. In the semiconductor device of the present embodiment, the first inclined surface 271a of the connection portion 271 at the inlet portion 27 side in the semiconductor device of the third embodiment has a shape extending to the bottom surface side of the inlet path 24 and includes the second inclined surface 271b, as depicted in FIG. 9. The outlet portion 28 side also is similarly formed. Other structures are the same as those in the semiconductor device of the third embodiment.

In the semiconductor device of the fourth embodiment, since the connection portion 271 includes the second inclined surface 271b, the flow path of the connection portion 271 can be partially enlarged as compared to the semiconductor device of the third embodiment, so that pressure loss in the connection portion 271 can be more effectively reduced. Additionally, since the connection portion 281 includes the second inclined surface 281b, the flow path of the connection portion 281 can be partially enlarged as compared to the semiconductor device of the third embodiment, so that pressure loss in the connection portion 281 can be more effectively reduced.

In order to confirm the effects of the semiconductor device of the present invention, a plurality of coolers 20 were prepared by differing the position of the connection portion 271 between the inlet path 24 and the inlet portion 27 disposed in the case 22 in a lateral direction of the case 22, and pressure losses were measured.

Figure 12:
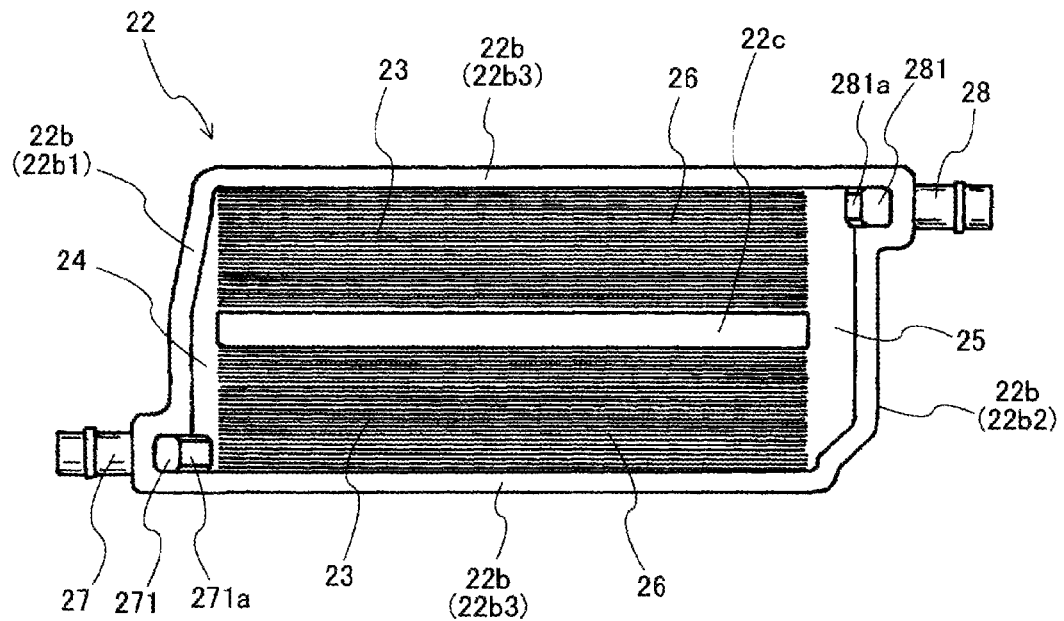
FIG. 12 is a plan view depicting an inner structure of a case of a semiconductor module of Example 1.

A cooler 20 of Example 1 includes the case 22 of the cooler 20 depicted in FIG. 12. Specifically, it is an example in which the connection portion 271 between an inlet path 24 and the inlet portion 27 disposed in the case 22 is disposed in such a position as to contact with an inside of the sidewall 22b3 in the longitudinal direction of the case 22.

Figure 13:
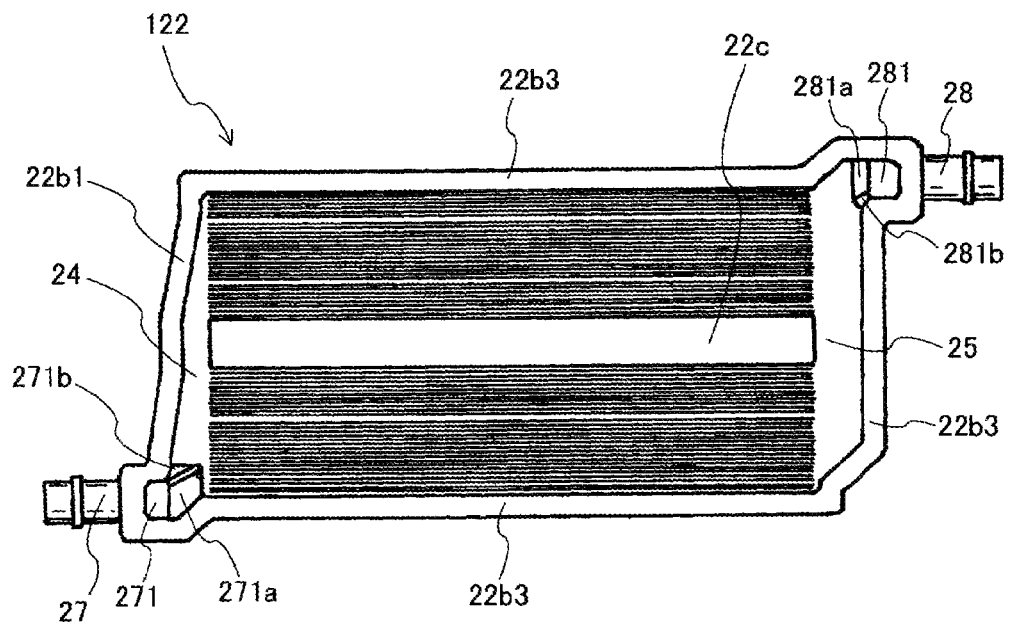
FIG. 13 is a plan view depicting an inner structure of a case of a semiconductor module of Comparative Example 1.

The cooler of Comparative Example 1 includes a case 122 depicted in FIG. 13. Specifically, it is an example in which the connection portion 271 between the inlet path 24 and the inlet portion 27 disposed in the case 122 is disposed in a position outside in the lateral direction of the case 122 from the sidewall 22b3 in the longitudinal direction of the case 122.

The cooler of Example 2 includes the case 22 depicted in FIG. 5.

Figure 14:
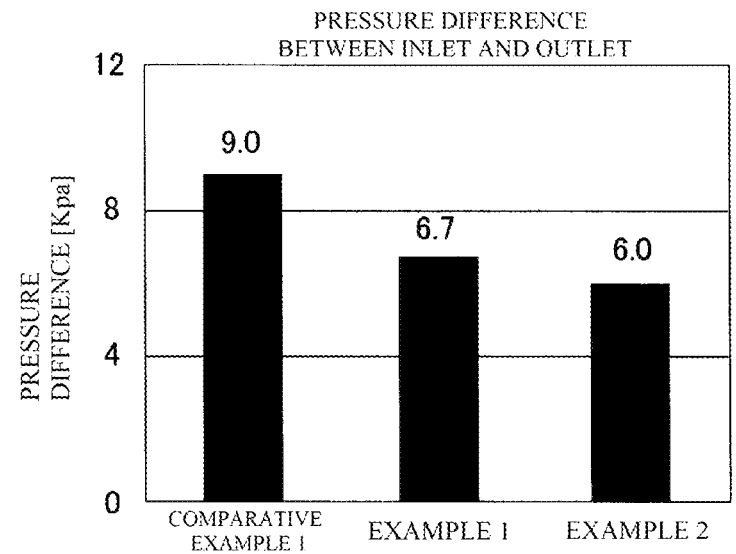
FIG. 14 is a graph depicting a pressure difference between Comparative Example 1 and Examples 1 and 2.

FIG. 14 depicts a graph of measurement results on a pressure difference between the inlet portion and the outlet portion for a cooling liquid in the above-described coolers of Examples 1 and 2 and Comparative Example 1. In FIG. 14, pressure losses in the coolers of Examples 1 and 2 were lower than in the cooler of Comparative Example 1, and particularly, the cooler of Example 2 had a lower pressure loss than Example 1. According to comparison results by thermal fluid simulation, in a case where a cooling liquid was flown at 10 L/min, respective pressure losses of Comparative Example 1, Example 1, and Example 2 were 9 kPa, 6.7 kPa, and 6.0 kpa.

Among pressures of a cooling liquid flowing through the cooling flow path 26, there are a pressure at which a refrigerant collides against the arranged fins 23, a pressure generated when it flows between the fins 23, and a pressure generated when it flows out from the outlet path. In Comparative Example 1, at the connection portion 271 of the inlet portion 27 side and the connection portion 281 of the outlet portion side, pressure is generated by forcing the flow into the inlet path 24 by using the sidewall 22b3 of the case 22. In contrast to this, in Example 1 and Example 2, the cooling liquid can be moved into the cooling flow path 26 without significantly changing the flow of the cooling liquid, so that load on a pump for circulating the cooling liquid can be made small.

Figure 11:
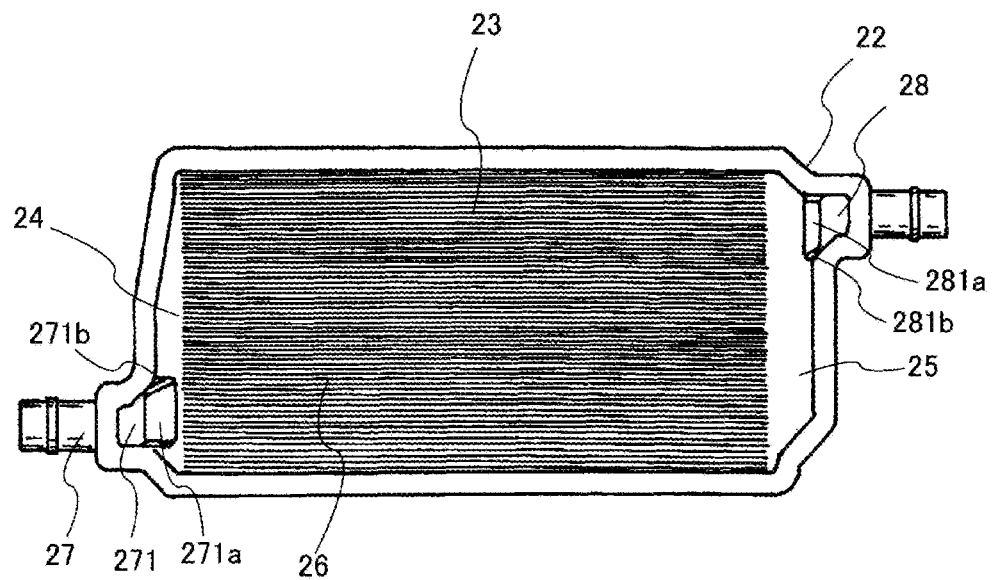
FIG. 11 is a plan view depicting an inner structure of a case of a semiconductor module of a fourth embodiment.

Next, in order to confirm an effect of the case 22 that does not include the partition 22c depicted in FIG. 5, i.e., an effect of the cooling flow path 26 that is not split, in the semiconductor module depicted in FIG. 10, and an effect of the connection portion 271 that includes the second inclined surface 271b and the connection portion 281 including the second inclined surface 281b in the semiconductor module of the present invention depicted in FIG. 11, there were prepared a plurality of coolers 20 that did not include the partition 22c and that were different depending on the presence or absence of the second inclined surfaces 271b and 281b, and pressure losses were measured. Additionally, heat generation statuses of the semiconductor elements 15 of the circuit element units 11A to 11F on the coolers 20 were examined.

A cooler 20 of Example 3 includes the case 22 of the cooler 20 depicted in FIG. 10. Specifically, it is an example that does not include the second inclined surfaces 271b and 281b.

Figure 15:
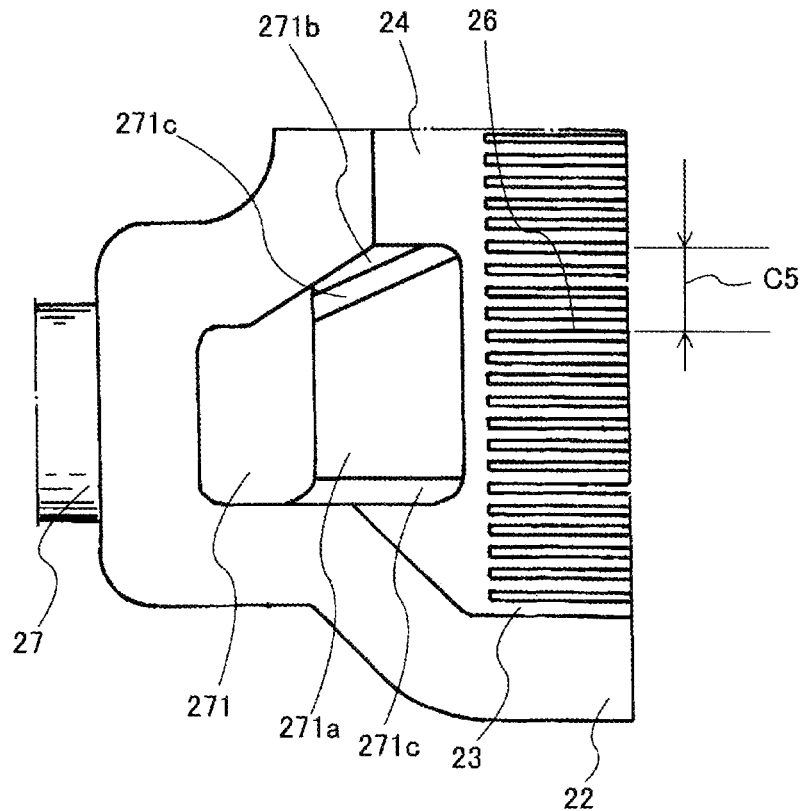
FIG. 15 is an enlarged view of a vicinity of a connection portion in a semiconductor module of Example 4.

A cooler 20 of Example 4 is an example that includes the second inclined surfaces 271b and 281b and whose chamfering length for forming the second inclined surfaces 271b and 281b is 5 mm, as depicted in an enlarged view of a vicinity of the connection portion 271 in FIG. 15. Except for the difference of the chamfering length, the cooler of Example 4 includes the same case 22 as in Example 5 that will be described below.

A cooler 20 of Example 5 includes the case 22 of the cooler 20 depicted in FIG. 11. Specifically, the cooler 20 of Example 5 is an example that includes the second inclined surfaces 271b and 281b and whose chamfering length for forming the second inclined surfaces 271b and 281b is 10 mm, as indicated in the enlarged view of the vicinity of the connection portion 271 in FIG. 9.

Figure 16:
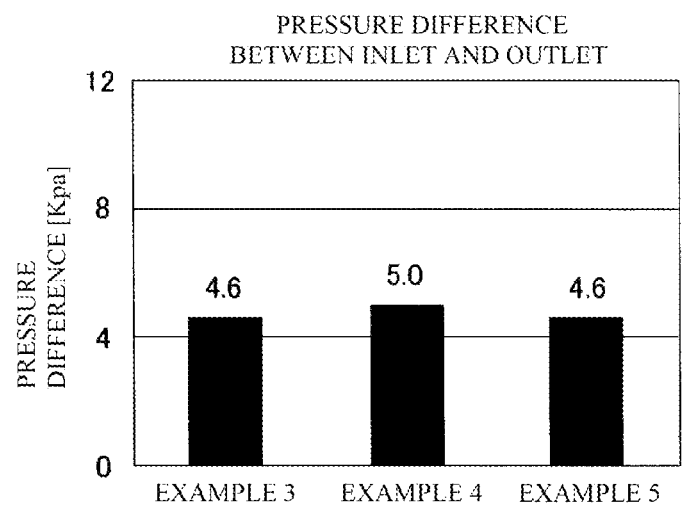
FIG. 16 is a graph depicting a pressure difference between Examples 3 to 5.

FIG. 16 depicts a graph of measurement results on a pressure difference between the inlet portion and the outlet portion for a cooling liquid in the above-described coolers of Examples 3 to 5. In FIG. 16, the cooler of Example 3 had a lower pressure loss than Example 2 of FIG. 14. According to comparison results by thermal fluid simulation, in a case where a cooling liquid was flown at 10 L/min, Example 2 had a pressure loss of 6.0 kpa, whereas Example 3 had a pressure loss of 4.6 kpa. These results showed that arranging the fins 23 entirely in the cooling flow path 26 without disposing the partition 22c can reduce about) kpa or more of pressure loss as compared to Example 2 including the partition 22c.

Figure 17:
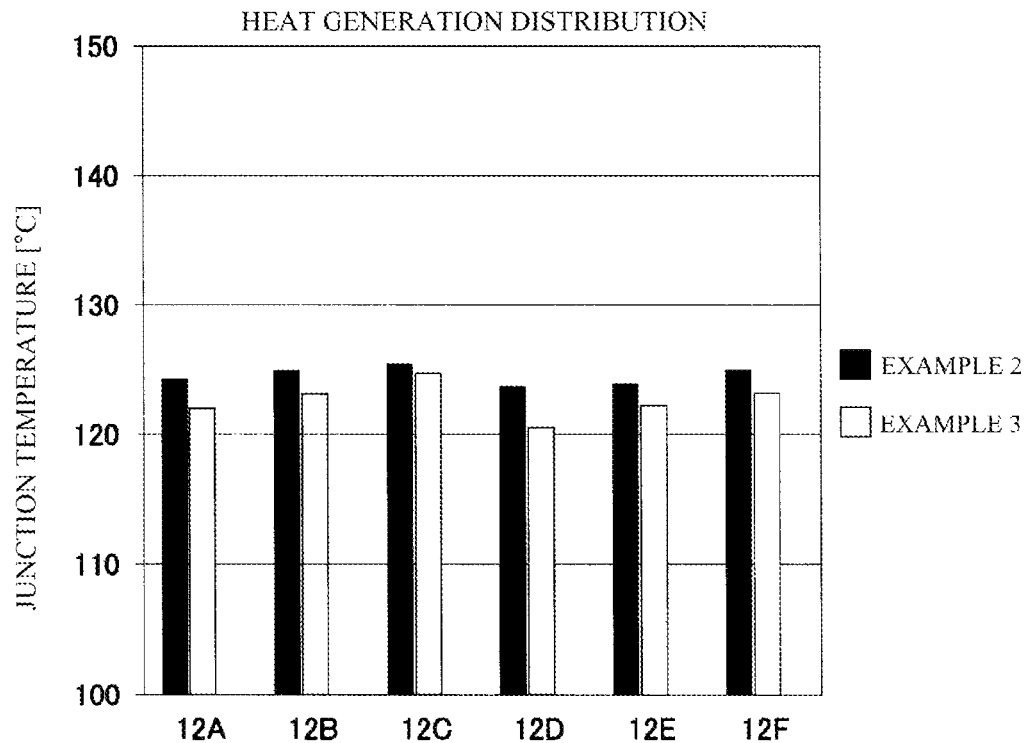
FIG. 17 is a graph depicting junction temperatures of respective semiconductor elements 15 in Examples 2 and 3.

FIG. 17 depicts measurement results on junction temperatures of the respective semiconductor elements 15 of the circuit element units 12A to 12F in a semiconductor module including the cooler of Example 2 and a semiconductor module including the cooler of Example 3. In FIG. 17, the semiconductor module including the cooler of Example 3 had lower temperatures in the semiconductor elements 15 and a smaller temperature variation than the semiconductor module including the cooler of Example 2.

Figure 18:
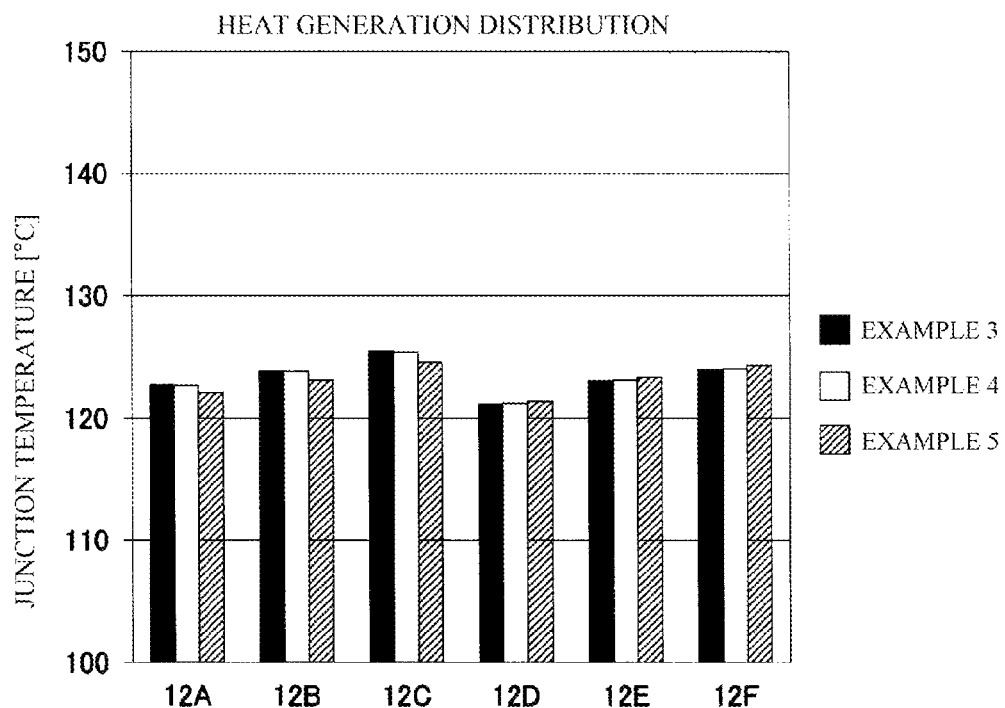
FIG. 18 is a graph depicting junction temperatures of respective semiconductor elements 15 in Examples 3 to 5.

In addition, pressure losses of the coolers of Examples 3 to 5 due to the presence or absence of chamfering and difference between chamfering degrees were compared by a graph depicted in FIG. 18. Example 5 chamfered at 10 mm had a smaller pressure loss than Example 4 chamfered at 5 mm. Examples 3 and 5 had equal pressure loss. In a comparison between junction temperatures of the respective semiconductor elements 15 of the circuit element units 12A to 12F depicted in FIG. 18 by the graph of measurement results, Example 5 had a smaller temperature variation in the respective semiconductor elements 15 of the circuit element units 12A to 12F than Example 3.

Fifth Embodiment

Figure 19:
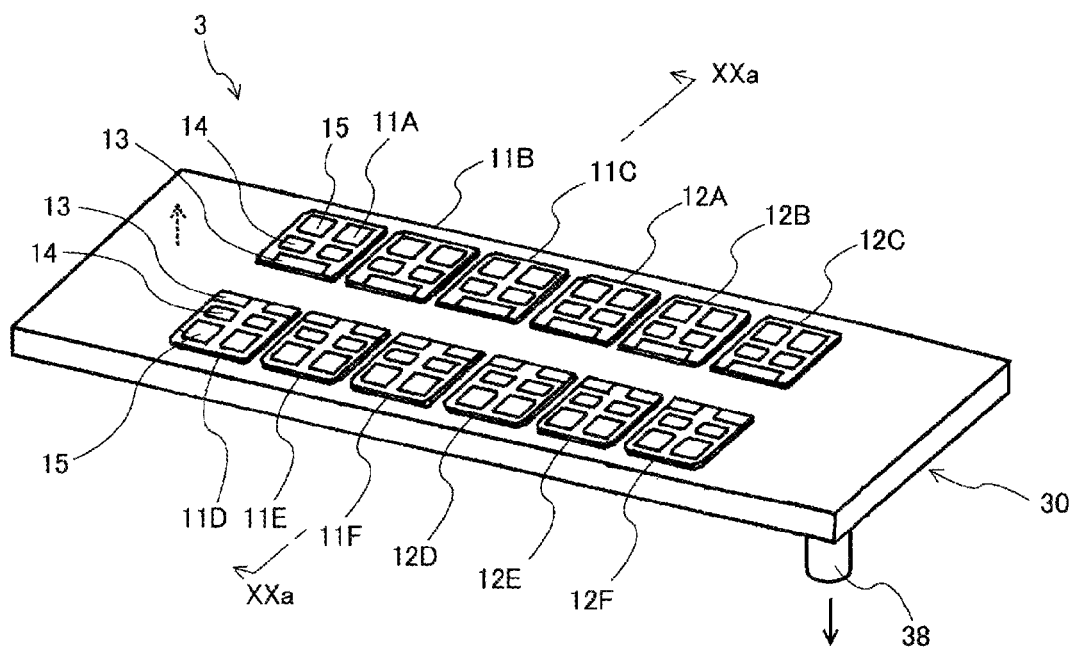
FIG. 19 is a perspective view of a semiconductor module of a fifth embodiment.

FIG. 19 depicts a perspective view of a semiconductor module 3 that is a semiconductor device of a fifth embodiment of the invention. The semiconductor module depicted in FIG. 19 is an example in which an inlet portion 37 and an outlet portion 38 for a cooling liquid are disposed on a bottom wall of a cooler 30. Arrows in the drawing indicate a direction in which the cooling liquid flows.

Figure 20:
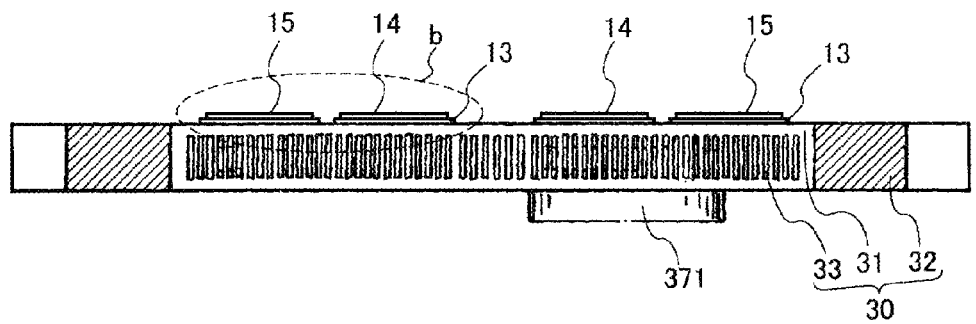
FIG. 20 A is a schematic view of the semiconductor module of FIG. 19 depicted by a section as viewed in an arrow direction of line XXa-XXa, and FIG. 20 B is a schematic view of an enlarged part of FIG. 20 A.
Figure 20:
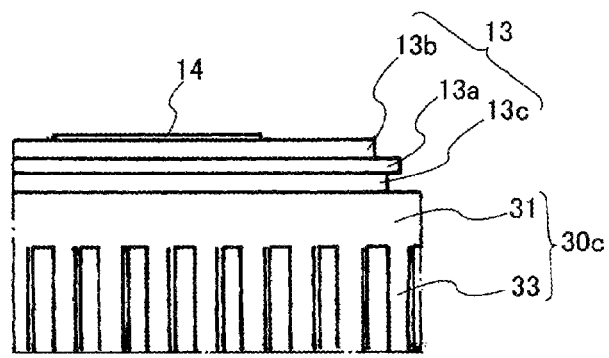

Additionally, FIG. 20 A is a schematic view of the semiconductor module of FIG. 19 depicted by a section as viewed in an arrow direction of line XXa-XXa, and FIG. 20 B is a schematic view of an enlarged part of FIG. 20 A.

The semiconductor module 3 includes the plurality of circuit element units 11A to 11F and 12A to 12F and the cooler 30 to which the circuit element units 11A to 11F and 12A to 12F are connected, as depicted in FIG. 19 and FIGS. 20 A and 20 B. The respective circuit element units 11A to 11F and 12A to 12F are the same as the circuit element units 11A to 11F and 12A to 12F of the semiconductor module 3 depicted in FIG. 1, and thus duplicated descriptions thereof are omitted below.

In the present embodiment, the cooler 30 includes a case 32 having a box shape with an opening at an upper part thereof, a heat dissipation substrate 31 (a heat dissipation portion) having a flat plate shape connected to upper ends of sidewalls of the case 32 without liquid leakage, and fins 33 that are attached onto a surface (a second surface) of the heat dissipating substrate 31 opposite to a surface (a first surface) thereof to which the respective circuit element units 11A to 11F and 12A to 12F are bonded and that have heat exchangeability as a heat sink. The cooler 30 of the present embodiment depicted in FIG. 20 has a shape in which, in a region where the fins 33 are disposed, roots of the fins 33 and the heat dissipation substrate 31 are integrally formed and tips of the fins 33 and a bottom wall of the case 32 are integrally formed. Such a shape can be obtained by producing a multi-hole plate (a multi-hole pipe) having a plurality of holes by extrusion molding of a metallic material. Production of a multi-hole plate by extrusion molding allows the cooler 30 to be produced more simply and easily at lower cost as compared to a method of producing the cooler 30 by separately preparing the heat dissipation substrate 31, the case 32, and the fins 33 and bonding the members together. In addition, as illustrated, the upper arm circuit element units 11A to 11C and 12A to 12C and the lower arm circuit element units 11D to 11F and 12D to 12F are arranged in two columns so as to be respectively in parallel along the direction where a cooling liquid flows. The plurality of upper arm circuit substrates 13 (second circuit substrates) and the plurality of lower arm circuit substrates 13 (first circuit substrates) respectively are aligned and disposed in parallel.

In the cooler 30 including the multi-hole plate, heat generated in the respective circuit element units 11A to 11F and 12A and 12F is transferred to a part corresponding to the heat dissipation substrate 31 including an upper surface of the multi-hole plate from the circuit substrates 13 and furthermore transferred to mutually connecting partition walls of holes of the multi-hole plate. The mutually connecting partition walls of the holes of the multi-hole plate correspond to the fins 33 in the cooler 30, and the holes of the multi-hole plate correspond to cooling flow paths that will be described later. Thus, distributing a cooling liquid in the holes of the multi-hole plate, i.e., in the cooling flow paths, allows the fins 33 to be cooled. The circuit element units 11A to 11F and 12A to 12F that generate heat are cooled by the cooler 30 in this manner.

Figure 21:
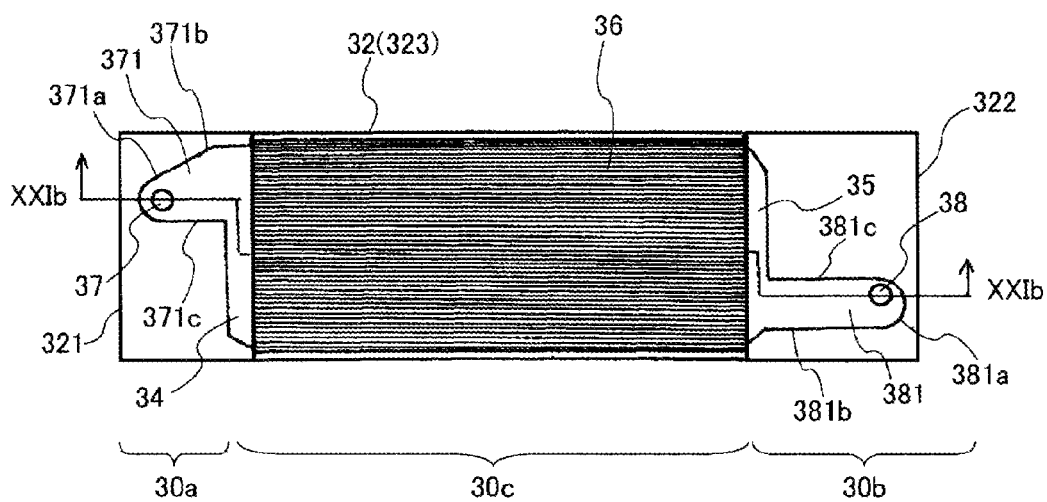
FIG. 21 are a plan view (FIG. 21 A) depicting an inner structure of the cooler 30 and a sectional view (FIG. 21 B) in an arrow direction of line XXIb-XXIb.
Figure 21:
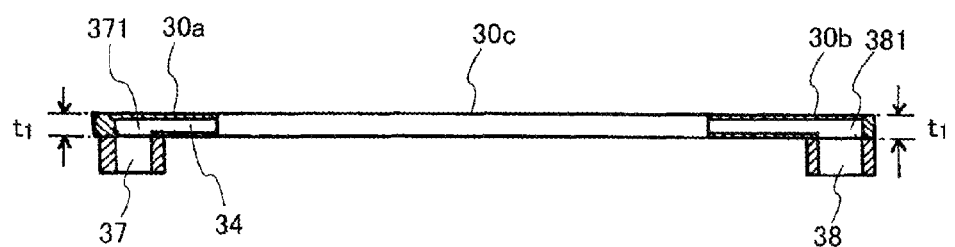

FIG. 21 are a plan view (FIG. 21 A) depicting an inner structure of the cooler 30 and a sectional view (FIG. 21 B) in an arrow direction of line XXIb-XXIb. As depicted in FIG. 21, an outer shape of the cooler 30 is a substantially rectangular parallelepiped shape. The cooler 30 includes an inlet header portion 30a for a cooling liquid, a cooling flow path portion 30c composed of a multi-hole plate, and an outlet header portion 30b for the cooling liquid. The inlet header portion 30a is arranged on a first sidewall side of the cooler 30, and the outlet header portion 30b is arranged on a second sidewall side opposing the first sidewall, respectively.

On a bottom wall of the inlet header portion 30a is disposed the inlet portion 37 for introducing a cooling liquid into an inside of the cooler 30. In an inside of the inlet header portion 30a are disposed an inlet path 34 for introducing the cooling liquid toward the fins 33 of the cooling flow path portion 30c and a connection portion 371 disposed between the inlet path 34 and the inlet portion 37.

On a bottom wall of the outlet header portion 30b is disposed the outlet portion 38 for discharging a cooling liquid outward from the inside of the cooler 30. In an inside the outlet header portion 30b are disposed an outlet path 35 for discharging the cooling liquid from the cooling flow path portion 30c to the outlet portion 38 and a connection portion 381 disposed between the outlet path 35 and the outlet portion 38.

The inlet portion 37 and the outlet portion 38 are disposed slightly inward from diagonal positions of the cooler 30. Axial lines of the inlet portion 37 and the outlet portion 38 are substantially orthogonal to a longitudinal direction of a cooling flow path 36, i.e., a direction in which a cooling liquid is distributed in the cooling flow path 36.

The inlet path 34 is formed so as to disperse a cooling liquid introduced from the connection portion 371 and flow the cooling liquid into the cooling flow path 36 along an inner surface of a sidewall 321 of the inlet header portion 30a in which the inlet portion 37 is disposed. In addition, the connection portion 371 is disposed between the inlet path 34 and the inlet portion 37. The connection portion 371 is disposed opposing a part positioned immediately below the circuit substrates 13 (second circuit substrates) in the cooling flow path.

The outlet path 35 is formed so as to discharge the cooling liquid having passed through the cooling flow path 36 to the outlet portion 38 along an inner surface of a sidewall 322 of the outlet header portion 30b in which the outlet portion 38 is disposed. In addition, the connection portion 381 is disposed between the outlet path 35 and the outlet portion 38. The connection portion 381 is disposed opposing a part positioned immediately below the circuit substrates 13 (first circuit substrates) in the cooling flow path.

The cooling flow path 36 is formed in a position where the fins 33 are housed between two sidewalls 323 in the longitudinal direction between the inlet path 34 and the outlet path 35, and is thereby configured to flow a cooling liquid to parts necessary for cooling the fins 33 as a heat sink. Since the inlet path 34 and the outlet path 35 are formed along the sidewalls 321 and 322 at short sides of the cooler 30, the cooling flow path 36 has a longer cooling liquid distributing direction length than cooling liquid distributing direction lengths in the inlet path 34 and the outlet path 35. This is advantageous in downsizing the cooler 30.

In addition, as in the semiconductor device of the first embodiment previously described, the cooling flow path 36 is not split into two by a partition. Thereby, reduction of pressure loss can be advantageously achieved. However, the semiconductor device of the present embodiment does not exclude that a partition is disposed in the cooling flow path 36 to split into a plurality of flow paths according to positions of the circuit element units 11A to 11F and 12A to 12F.

The longitudinal directions of the inlet path 34 and the outlet path 35 are substantially orthogonal to the longitudinal direction of the cooling flow path 36.

The plurality of fins 33 are disposed in the cooling flow path 36. The heat sink comprising the plurality of fins has a substantially rectangular parallelepiped outer shape and is disposed in parallel to a direction in which a cooling liquid flows in the cooling flow path 36. In regards to the fins of the heat sink, partition walls of the multi-hole plate formed by extrusion molding correspond to the fins in the present embodiment. As previously described in the first embodiment, in the case where the cooler 30 is formed by separately preparing a heat dissipation substrate, a case, and fins and bonding them together, the blade fins 23a or the corrugated fins 23b depicted in FIG. 6 can also be used.

When using the cooler 30, for example, a pipe (unillustrated) that is connected to a pump (unillustrated) disposed on an upstream side of the inlet portion 37 is connected to the inlet portion 37, and a pipe (unillustrated) that is connected to a heat exchanger (unillustrated) disposed on a downstream side of the outlet portion 38 is connected to the outlet portion 38. A cooling liquid after having been heat-exchanged by the heat exchanger is introduced to the pump, whereby there is formed a closed-loop cooling liquid flow path that includes the cooler 30, the pump, and the heat exchanger. The cooling liquid is forcibly circulated by the pump in such a closed loop. Water, a long life coolant (LLC), or the like can be used as a cooling liquid.

The inlet header portion 30a with the inlet portion 37 and the inlet path 34 disposed thereon, the outlet header portion 30b with the outlet portion 38 and the outlet path 35 disposed thereon, and the cooling flow path portion 30c with the cooling flow path 36 formed therein are made as small and thin as possible in a range having a predetermined coolability. For example, thinning is made so that a ratio of a thickness of the cooling flow path 36 to an entire width of the cooling flow path 36, i.e., a length between inner walls in the longitudinal direction of the case 32 is about from 1:8 to 1:14.

The connection portion 371 between the inlet portion 37 and the inlet path 34 is formed by inner walls formed in the inlet header portion 30a. The inner walls include an arc-shaped sidewall 371a that is located on a side opposite to the cooling flow path 36 as viewed from the inlet portion 37 and is substantially concentric with an opening (an inlet) of the inlet portion 37, a linear sidewall 371b connected to one end of the arc-shaped sidewall 371a and extending to a widthwise end of the cooling flow path 36, and a linear sidewall 371c connected to the other end of the arc-shaped sidewall 371a and extending substantially in parallel with the longitudinal direction of the cooling flow path 36.

The connection portion 371 is formed by the inner walls configured as above, whereby a cooling liquid introduced from the inlet portion 37 to the connection portion 371 is introduced to the inlet path 34 and the cooling flow path 36 while a part of the cooling liquid is flowing to the widthwise end of the cooling flow path 36.

The connection portion 381 between the outlet portion 38 and the outlet path 35 is formed by inner walls formed in the outlet header portion 30b. The inner walls include an arc-shaped sidewall 381a that is located on a side opposite to the cooling flow path 36 as viewed from the outlet portion 38 and has a different center from an opening (an outlet) of the outlet portion 38, a linear sidewall 381b connected to one end of the arc-shaped sidewall 381a and extending substantially in parallel with the longitudinal direction of the cooling flow path 36, and a linear sidewall 381c connected to the other end of the arc-shaped sidewall 381a and extending substantially in parallel with the longitudinal direction of the cooling flow path 36. The outlet is formed closer to a linear sidewall 381c side in a region splitting between the linear sidewall 381b and the linear sidewall 381c, i.e., to the inlet of the inlet portion 37.

Figure 22:
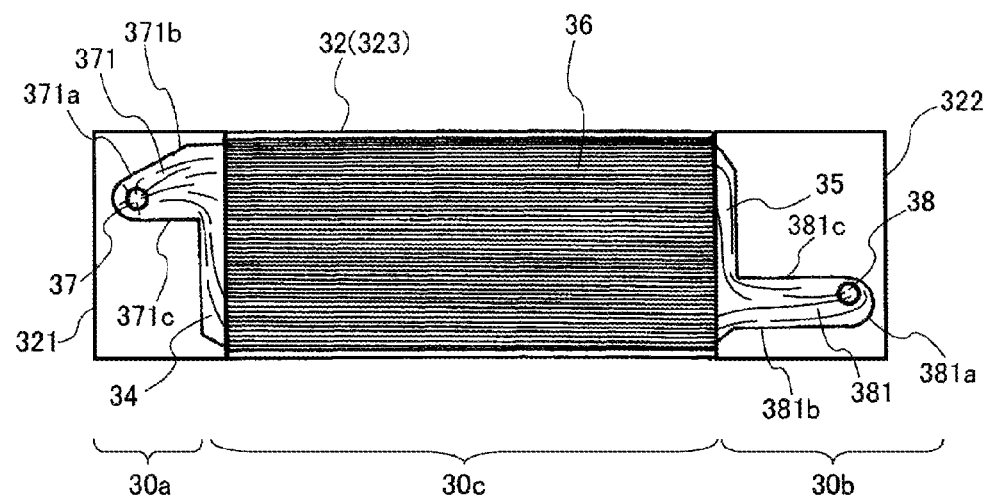
FIG. 22 is an illustrative view depicting the flow of a cooling liquid in an inlet path and an outlet path of the cooler of FIG. 21.

The connection portion 381 is formed by the inner walls configured as above, whereby a cooling liquid having passed through the outlet path 35 from the cooling flow path 36 is directed to the outlet portion 38 while being converged in the connection portion 381. Since the outlet is arranged closer to the inlet from a longitudinal center line of the connection portion 381, a flow rate of the cooling liquid flowing in the connection portion 381 becomes asymmetrical to the section of the connection portion 381 and flows out from the outlet to the outlet portion 38 while whirling, as depicted in FIG. 22. In the illustrated example, the cooling liquid whirls counterclockwise. Due to such a structure, the cooling liquid having flown immediately below each of the upper arm circuit substrates 13 and the lower arm circuit substrates 13 arranged in parallel flows smoothly along the outlet path 35 and the connection portion 381 without colliding and flows out from the outlet portion 38. Pressure loss in the cooler 30 is reduced.

As can be understood from the comparison of positional relationship between FIG. 19 and FIG. 21, the connection portion 371 at the inlet portion 37 side is disposed in a position opposing to a part immediately below the circuit substrates 13 in the cooling flow path 36. Thereby, a cooling liquid from the inlet portion 37 can be straightly introduced to the fins 33 of the part immediately below the circuit substrates 13 where temperature tends to be highest in the cooling flow path 36, so that the flow rate of the cooling liquid directed to the fins of the part immediately below the circuit substrates 13 can be made higher than in other parts, and eventually, the semiconductor elements 14 and 15 on the circuit substrates can be effectively cooled. Of the semiconductor elements 14 and 15, the semiconductor elements 15 that are IGBT chips generate more heat than the semiconductor elements 14 that are FWD chips. Thus, the connection portion 371 of the inlet portion 37 side is more preferably disposed in a position opposing a part immediately below the semiconductor elements 15 (second semiconductor elements) in the cooling flow path 36. The connection portion 371 of the inlet portion 37 side is located closer to the center from an end of the inlet path by a length corresponding to 1/10 to 1/3 of the entire width of the cooling flow path 36.

Additionally, the connection portion 381 of the outlet portion 38 side is similarly disposed in a position opposing to a part immediately below the circuit substrates 13 in the cooling flow path 36. Thereby, a cooling liquid having passed between the fins 33 of the part immediately below the circuit substrates 13 where temperature tends to be highest in the cooling flow path 36 can be straightly introduced to the outlet portion 38, so that the flow rate of the cooling liquid having passed between the fins 33 of the part immediately below the circuit substrates 13 can be made higher than in other parts, and eventually the semiconductor elements 14 and 15 on the circuit substrates can be effectively cooled. Of the semiconductor elements 14 and 15, the semiconductor elements 15 that are IGBT chips generate more heat than the semiconductor elements 14 that are FWD chips. Thus, the connection portion 381 of the inlet portion 38 side is more preferably disposed in a position opposing a part immediately below the semiconductor elements 15 (first semiconductor elements) in the cooling flow path 36. The connection portion 381 of the outlet portion 38 side is located closer to the center from an end of the outlet path, with a length corresponding to 1/10 to 1/3 of the entire width of the cooling flow path 36.

The inlet path 34 and the outlet path 35 have planar shapes asymmetrical to each other. Specifically, the inlet path 34 is formed as a flow path with a narrow width in order to allow a cooling liquid to flow as evenly as possible from one end of the widthwise direction of the cooling flow path 36 to the other end thereof. In contrast to this, the outlet path 35 is formed as a flow path with a large width to some extent in order to allow the cooling liquid to flow with less resistance from the cooling flow path 36 to the outlet portion.

Additionally, of the inner walls of the connection portion 371 connecting with the inlet path 34, the arc-shaped sidewall 371a is an arc-shaped curved surface substantially concentric with the inlet portion 37, whereas, of the inner walls of the connection portion 381 connecting with the outlet path 35, the arc-shaped sidewall 381a is an arc-shaped curved surface having a center different from the outlet portion 38. In addition, the arc-shaped sidewall 381a has a larger curvature radius than a curvature radius of the arc-shaped sidewall 371a. Furthermore, while the linear sidewall 371b of the connection portion 371 extends to the widthwise end of the cooling flow path 36, the linear sidewall 381b of the connection portion 381 extends substantially in parallel with the longitudinal direction of the cooling flow path 36. As a result, the inlet path 34 and the outlet path 35 have the planar shapes asymmetrical to each other.

The reason that the inlet path 34 and the outlet path 35 have mutually different, i.e., asymmetrical planar shapes is that they are formed into optimum shapes in order to reduce pressure loss while suppressing, as much as possible, the occurrence of a turbulent flow in the connection portions 371 and 381. When the arc-shaped sidewall 381a of the inner walls of the connection portion 381 was located concentrically with the outlet portion 38, a large turbulent flow of a cooling liquid occurred. For this reason, in order to suppress the occurrence of a turbulent flow, it is optimum to form the arc-shaped sidewall 381a in a position eccentric to the outlet portion 38.

The cooler 30 of the present embodiment can be formed using the same metallic material as the cooler 20 of the first embodiment. In the case where the cooler 30 includes the inlet header portion 30a, the cooling flow path portion 30c composed of a multi-hole plate, and the outlet header portion 30b, the cooler 30 can be produced by bonding these members together. Metallic bonding of these members is more preferably performed by friction stir welding to ensure the bonding. Bonding portions by friction stir welding have a metallic structure inherent to friction stir welding.

The semiconductor module 3 of the present embodiment can reduce pressure loss in a thin-type cooler in which the inlet portion 37 and the outlet portion 38 are disposed on the bottom wall of the cooler 30.

Sixth Embodiment

Figure 23:
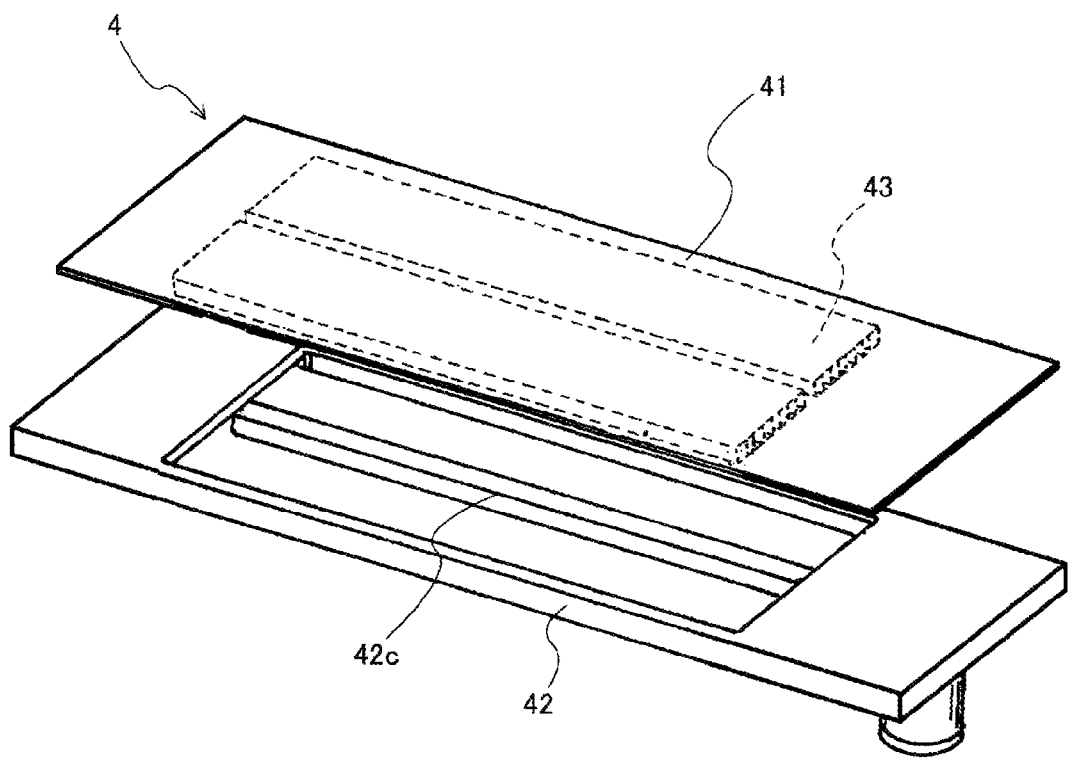
FIG. 23 is an exploded perspective view of a semiconductor module of a sixth embodiment.

FIG. 23 depicts an exploded perspective view of a semiconductor module 4 that is a semiconductor device of a sixth embodiment of the invention. The semiconductor module 4 of the present embodiment is produced by separately preparing a heat dissipation substrate 41, a case 42 with a partition 42c, and blade fins 43, respectively, and bonding them together. Suitable bonding is friction stir welding previously described.

Seventh Embodiment

Figure 24:
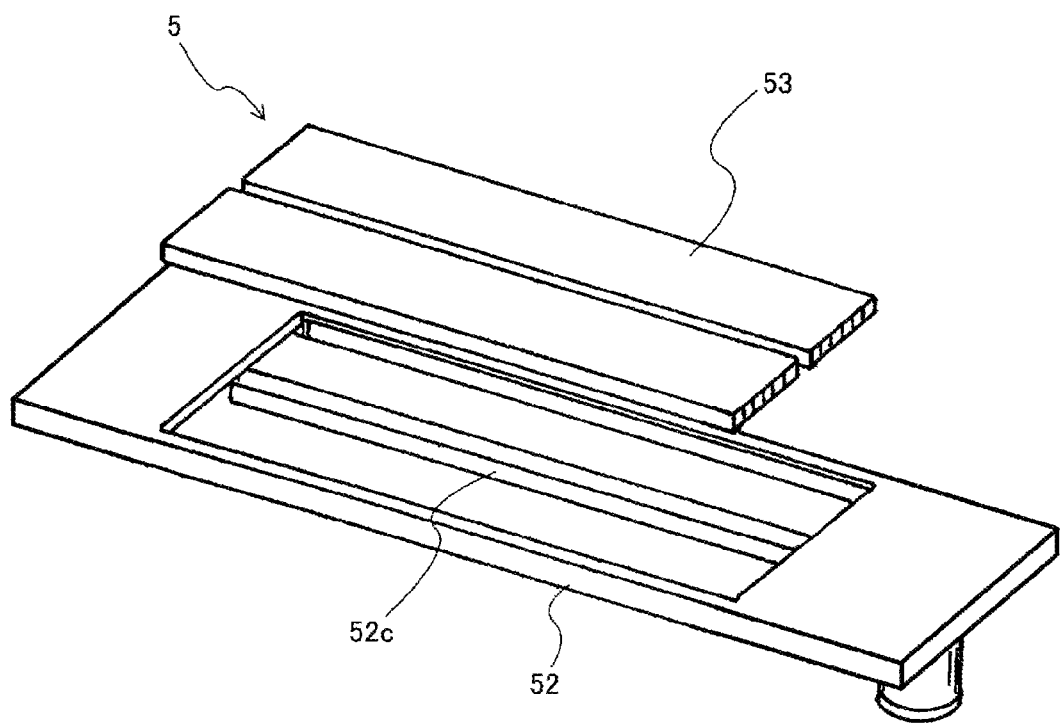
FIG. 24 is an exploded perspective view of a semiconductor module of a seventh embodiment.

FIG. 24 depicts an exploded perspective view of a semiconductor module 5 that is a semiconductor device of a seventh embodiment of the invention. The semiconductor module 5 of the present embodiment is produced by separately preparing two multi-hole plates 53 serving as both a heat dissipation substrate and fins, a case 52, and a partition member 52c, respectively, and bonding them together. The multi-hole plates 53 can be molded by extrusion molding. In addition, for suitable bonding between the multi-hole plates 53 and the case 52, friction stir welding previously described is performed.

Eighth Embodiment

Figure 25:
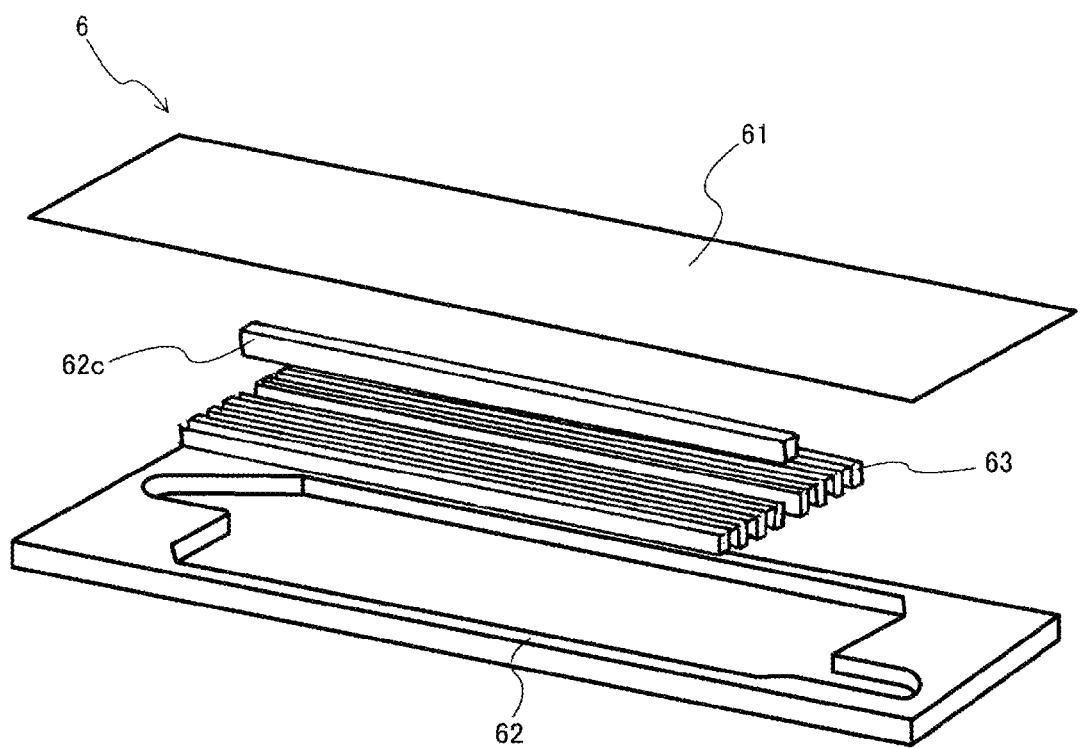
FIG. 25 is an exploded perspective view of a semiconductor module of an eighth embodiment.

FIG. 25 depicts an exploded perspective view of a semiconductor module 6 that is a semiconductor device of an eighth embodiment of the invention. The semiconductor module 6 of the present embodiment is produced by separately preparing a thin heat dissipation substrate 61, corrugated fins 63, a case 62, and a partition member 62c, respectively, and bonding them together by brazing. In the semiconductor module 6 of the present embodiment, since the thin heat dissipation substrate 61 is used and a cooler is produced by brazing, there are advantages in that the cooler can be made thin and can be produced simply and easily at low cost.

In the semiconductor modules 4 to 6 of the sixth to eighth embodiments, the members for producing the coolers of the semiconductor modules are different, but the coolers assembled are provided with the structure of the fifth embodiment and therefore have the effects obtained by the structure of the fifth embodiment.

While the embodiments of the semiconductor device of the present invention have been described using the drawings hereinabove, it is obvious that the semiconductor device of the invention is not limited to the descriptions of the respective embodiments and drawings and a large number of modifications can be made without departing from the gist of the invention.

DESCRIPTION OF SYMBOLS

1, 3, 4, 5, 6: Semiconductor module
11A to 11F, 12A to 12F: Circuit element unit
13: Circuit substrate
13a: Insulation plate
13b, 13c: Conductor layer
14, 15: Semiconductor element
16, 17: Bonding layer
20, 30: Cooler
21, 31, 41, 61: Heat dissipation substrate (Heat dissipation portion)
22, 32: Case
23, 33: Fin
24, 34: Inlet path
25, 35: Outlet path
26, 36: Cooling flow path
27, 37: Inlet portion
271, 371: Connection portion
28, 38: Outlet portion
281, 381: Connection portion
71, 72: Inverter circuit
73, 74: Three-phase alternating current motor
C: Clearance

The invention claimed is:

1. A semiconductor device comprising a first circuit substrate and a second circuit substrate, a first semiconductor element mounted on the first circuit substrate and a second semiconductor element mounted on the second circuit substrate, and a cooler on which the first circuit substrate and the second circuit substrate are mounted and which cools the first semiconductor element and the second semiconductor element, wherein the cooler comprises:
    a heat dissipation portion that includes a first surface and a second surface opposing the first surface and on which the first circuit substrate and the second circuit substrate are bonded to the first surface;
    fins disposed on the second surface;
    a case that includes a first sidewall and a second sidewall opposing the first sidewall, that houses the fins, and that is connected to the heat dissipation portion;
    an inlet portion for a cooling liquid disposed on the first sidewall and an outlet portion therefor disposed on the second sidewall;
    an inlet path connected to the inlet portion and formed along an inner surface of the first sidewall;
    an outlet path connected to the outlet portion and formed along an inner surface of the second sidewall; and
    a cooling flow path formed in a position where the fins are housed between the inlet path and the outlet path,
    wherein the inlet path and the outlet path have planar shapes asymmetrical to each other, and wherein a connection portion between the inlet path and the inlet portion is opposed to the cooling flow path immediately below the second circuit substrate arranged on the cooler, and a connection portion between the outlet path and the outlet portion is opposed to the cooling flow path immediately below the first circuit substrate arranged on the cooler, and
    wherein the inlet portion is installed in the first sidewall of the case; a height of an opening of the inlet portion is higher than a height of the inlet path; and the connection portion between the inlet path and the inlet portion includes an inclined surface inclined toward the cooling flow path.

2. The semiconductor device according to claim 1, wherein the connection portion between the inlet portion and the inlet path further includes an inclined surface inclined from a bottom surface of the connection portion to a longitudinal direction of the inlet path.

3. The semiconductor device according to claim 1, wherein the inlet path is formed into a shape having a flow path width tapered toward a downstream side of the inlet path.

4. The semiconductor device according to claim 1, wherein the outlet portion is installed in the second sidewall of the case; a height of an opening of the outlet portion is higher than a height of the outlet path; and the connection portion between the outlet path and the outlet portion includes an inclined surface inclined toward the cooling flow path.

5. The semiconductor device according to claim 4, wherein the connection portion between the outlet portion and the outlet path further includes an inclined surface inclined from a bottom surface of the connection portion to a longitudinal direction of the outlet path.

6. The semiconductor device according to claim 1, wherein the cooling flow path has a longer length than lengths of the inlet path and the outlet path.

7. A semiconductor device comprising a first circuit substrate and a second circuit substrate, a first semiconductor element mounted on the first circuit substrate and a second semiconductor element mounted on the second circuit substrate, and a cooler on which the first circuit substrate and the second circuit substrate are mounted and which cools the first semiconductor element and the second semiconductor element, wherein the cooler comprises:
    a heat dissipation portion that includes a first surface and a second surface opposing the first surface and on which the first circuit substrate and the second circuit substrate are bonded to the first surface;
    fins disposed on the second surface;
    a case that includes a first sidewall and a second sidewall opposing the first sidewall, that houses the fins, and that is connected to the heat dissipation portion;
    an inlet portion for a cooling liquid disposed on the first sidewall and an outlet portion therefor disposed on the second sidewall;

an inlet path connected to the inlet portion and formed along an inner surface of the first sidewall;

an outlet path connected to the outlet portion and formed along an inner surface of the second sidewall; and a cooling flow path formed in a position where the fins are housed between the inlet path and the outlet path, wherein the inlet path and the outlet path have planar shapes asymmetrical to each other, and wherein a connection portion between the inlet path and the inlet portion is opposed to the cooling flow path immediately below the second circuit substrate arranged on the cooler and a connection portion between the outlet path and the outlet portion is opposed to the cooling flow path immediately below the first circuit substrate arranged on the cooler, wherein the inlet portion is attached to a bottom wall of the case, and wherein the inlet path is larger than the outlet path.

8. The semiconductor device according to claim 7, wherein the connection portion between the inlet portion and the inlet path includes an arc-shaped sidewall substantially concentric with the inlet portion.

9. The semiconductor device according to claim 7, wherein the connection portion between the outlet portion and the outlet path includes an arc-shaped sidewall eccentric from the outlet portion.

10. The semiconductor device according to claim 7, wherein the cooling flow path has a longer length than lengths of the inlet path and the outlet path.

11. The semiconductor device according to claim 1, wherein the heat dissipation portion is a heat dissipation substrate, and the heat dissipation substrate and the case are metallically bonded.

12. The semiconductor device according to claim 1, wherein at least a part of an assembly including the heat dissipation portion, the fins, and the case is integrally molded by extrusion molding.

13. The semiconductor device according to claim 1, wherein the heat dissipation portion is a heat dissipation substrate, and the heat dissipation substrate, the fins, and the case are integrally molded by brazing.

14. The semiconductor device according to claim 7, wherein the heat dissipation portion is a heat dissipation substrate, and the heat dissipation substrate and the case are metallically bonded.

15. The semiconductor device according to claim 7, wherein at least a part of an assembly including the heat dissipation portion, the fins, and the case is integrally molded by extrusion molding.

16. The semiconductor device according to claim 7, wherein the heat dissipation portion is a heat dissipation substrate, and the heat dissipation substrate, the fins, and the case are integrally molded by brazing.

* * * * *